United States Patent
Shanbhogue et al.

(10) Patent No.: US 10,962,596 B2
(45) Date of Patent: Mar. 30, 2021

(54) SYSTEM, APPARATUS AND METHOD FOR IN-FIELD SELF TESTING IN A DIAGNOSTIC SLEEP STATE

(71) Applicant: Intel Corporation, Santa Clara, CA (US)

(72) Inventors: Vedvyas Shanbhogue, Austin, TX (US); Jeff Huxel, Austin, TX (US); Wei Li, Austin, TX (US); Sanjoy Mondal, Austin, TX (US); Arvind Raman, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/839,238

(22) Filed: Apr. 3, 2020

(65) Prior Publication Data

US 2020/0300911 A1 Sep. 24, 2020

Related U.S. Application Data

(63) Continuation of application No. 15/825,352, filed on Nov. 29, 2017, now Pat. No. 10,620,266.

(51) Int. Cl.
*G06F 11/00* (2006.01)
*G01R 31/3187* (2006.01)
(Continued)

(52) U.S. Cl.
CPC ... *G01R 31/3187* (2013.01); *G01R 31/31721* (2013.01); *G01R 31/31919* (2013.01); *G06F 1/3203* (2013.01); *G06F 1/3243* (2013.01); *G06F 11/008* (2013.01); *G06F 11/0793* (2013.01); *G06F 11/2242* (2013.01); *G06F 11/263* (2013.01); *G06F 11/273* (2013.01); *G06F 11/3452* (2013.01); *G06F 11/3466* (2013.01)

(58) Field of Classification Search
CPC .... G06F 11/2242; G06F 11/27; G06F 11/263; G06F 11/273
See application file for complete search history.

(56) References Cited

U.S. PATENT DOCUMENTS 5,163,153 A 11/1992 Cole et al.
5,522,087 A 5/1996 Hsiang
(Continued)

FOREIGN PATENT DOCUMENTS

EP 1 282 030 A1 5/2003

OTHER PUBLICATIONS

Intel Developer Forum, IDF2010, Opher Kahn, et al., "Intel Next Generation Microarchitecture Codename Sandy Bridge: New Processor Innovations," Sep. 13, 2010, 58 pages.
(Continued)

*Primary Examiner* — Charles Ehne
(74) *Attorney, Agent, or Firm* — Trop, Pruner & Hu, P.C.

(57) ABSTRACT

In one embodiment, a processor includes at least one core and an interface circuit to interface the at least one core to additional circuitry of the processor. In response to an in-field self test instruction, at least one core may save state to a low power memory, enter into a diagnostic sleep state and execute an in-field self test in the diagnostic sleep state in which the at least one core appears to be inactive. Other embodiments are described and claimed.

20 Claims, 22 Drawing Sheets

(51) Int. Cl.

| | | |
|---|---|---|
| G06F 1/3203 | (2019.01) | |
| G01R 31/317 | (2006.01) | |
| G01R 31/319 | (2006.01) | |
| G06F 1/3234 | (2019.01) | |
| G06F 11/34 | (2006.01) | |
| G06F 11/07 | (2006.01) | |
| G06F 11/273 | (2006.01) | |
| G06F 11/22 | (2006.01) | |
| G06F 11/263 | (2006.01) | |

(56) References Cited

U.S. PATENT DOCUMENTS

| | | |
|---|---|---|
| 5,590,341 A | 12/1996 | Matter |
| 5,621,250 A | 4/1997 | Kim |
| 5,931,950 A | 8/1999 | Hsu |
| 6,748,546 B1 | 6/2004 | Mirov et al. |
| 6,792,392 B1 | 9/2004 | Knight |
| 6,823,516 B1 | 11/2004 | Cooper |
| 6,829,713 B2 | 12/2004 | Cooper et al. |
| 6,996,728 B2 | 2/2006 | Singh |
| 7,010,708 B2 | 3/2006 | Ma |
| 7,043,649 B2 | 5/2006 | Terrell |
| 7,093,147 B2 | 8/2006 | Farkas et al. |
| 7,111,179 B1 | 9/2006 | Girson et al. |
| 7,194,643 B2 | 3/2007 | Gonzalez et al. |
| 7,272,730 B1 | 9/2007 | Acquaviva et al. |
| 7,412,615 B2 | 8/2008 | Yokota et al. |
| 7,434,073 B2 | 10/2008 | Magklis |
| 7,437,270 B2 | 10/2008 | Song et al. |
| 7,454,632 B2 | 11/2008 | Kardach et al. |
| 7,529,956 B2 | 5/2009 | Stufflebeam |
| 7,539,885 B2 | 5/2009 | Ma |
| 7,730,340 B2 | 6/2010 | Hu et al. |
| 10,037,227 B2 * | 7/2018 | Therien ............ G06F 9/461 |
| 2001/0044909 A1 | 11/2001 | Oh et al. |
| 2002/0156993 A1 | 10/2002 | Suzuoki et al. |
| 2002/0194509 A1 | 12/2002 | Plante et al. |
| 2003/0061383 A1 | 3/2003 | Zilka |
| 2004/0064752 A1 | 4/2004 | Kazachinsky et al. |
| 2004/0098560 A1 | 5/2004 | Storvik et al. |
| 2004/0139356 A1 | 7/2004 | Ma |
| 2004/0268166 A1 | 12/2004 | Farkas et al. |
| 2005/0022038 A1 | 1/2005 | Kaushik et al. |
| 2005/0033881 A1 | 2/2005 | Yao |
| 2005/0132238 A1 | 6/2005 | Nanja |
| 2005/0240850 A1 | 10/2005 | Ohwada |
| 2006/0050670 A1 | 3/2006 | Hillyard et al. |
| 2006/0053326 A1 | 3/2006 | Naveh |
| 2006/0059286 A1 | 3/2006 | Bertone et al. |
| 2006/0069936 A1 | 3/2006 | Lint et al. |
| 2006/0117202 A1 | 6/2006 | Magklis et al. |
| 2006/0184287 A1 | 8/2006 | Belady et al. |
| 2006/0259828 A1 | 11/2006 | Swoboda |
| 2007/0005995 A1 | 1/2007 | Kardach et al. |
| 2007/0016817 A1 | 1/2007 | Albonesi et al. |
| 2007/0079294 A1 | 4/2007 | Knight |
| 2007/0106827 A1 | 5/2007 | Boatright et al. |
| 2007/0156992 A1 | 7/2007 | Jahagirdar |
| 2007/0214342 A1 | 9/2007 | Newburn |
| 2007/0226568 A1 * | 9/2007 | Anzou ............ G01R 31/31721 714/733 |
| 2007/0239398 A1 | 10/2007 | Song et al. |
| 2007/0245163 A1 | 10/2007 | Lu et al. |
| 2008/0023700 A1 | 1/2008 | Gschwind |
| 2008/0028240 A1 | 1/2008 | Arai et al. |
| 2008/0250260 A1 | 10/2008 | Tomita |
| 2009/0006871 A1 | 1/2009 | Liu et al. |
| 2009/0150695 A1 | 6/2009 | Song et al. |
| 2009/0150696 A1 | 6/2009 | Song et al. |
| 2009/0158061 A1 | 6/2009 | Schmitz et al. |
| 2009/0158067 A1 | 6/2009 | Bodas et al. |
| 2009/0172375 A1 | 7/2009 | Rotem et al. |
| 2009/0172428 A1 | 7/2009 | Lee |
| 2009/0235105 A1 | 9/2009 | Branover et al. |
| 2010/0115309 A1 | 5/2010 | Carvalho et al. |
| 2010/0146513 A1 | 6/2010 | Song |
| 2010/0191997 A1 | 7/2010 | Dodeja et al. |
| 2011/0078463 A1 | 3/2011 | Fleming et al. |
| 2011/0154090 A1 | 6/2011 | Dixon et al. |
| 2012/0079290 A1 | 3/2012 | Kumar |
| 2012/0246506 A1 | 9/2012 | Knight |
| 2013/0061064 A1 | 3/2013 | Ananthakrishnan et al. |
| 2013/0080803 A1 | 3/2013 | Ananthakrishnan et al. |
| 2013/0080804 A1 | 3/2013 | Ananthakrishan et al. |
| 2013/0111120 A1 | 5/2013 | Ananthakrishnan et al. |
| 2013/0111121 A1 | 5/2013 | Ananthakrishnan et al. |
| 2013/0111226 A1 | 5/2013 | Ananthakrishnan et al. |
| 2013/0111236 A1 | 5/2013 | Ananthakrishnan et al. |
| 2013/0346774 A1 | 12/2013 | Bhandaru et al. |
| 2014/0068290 A1 | 3/2014 | Bhandaru et al. |
| 2014/0129797 A1 | 5/2014 | Arndt |
| 2014/0195829 A1 | 7/2014 | Bhandaru et al. |
| 2014/0208141 A1 | 7/2014 | Bhandaru et al. |
| 2015/0081980 A1 | 3/2015 | Walker |
| 2016/0224090 A1 | 8/2016 | Gendler et al. |
| 2016/0224098 A1 | 8/2016 | Gendler et al. |
| 2018/0180672 A1 * | 6/2018 | Maeda ............ G01R 31/31725 |

OTHER PUBLICATIONS

SPEC—Power and Performance, Design Overview V1.10, Standard Performance Information Corp., Oct. 21, 2008, 6 pages.

Intel Technology Journal, "Power and Thermal Management in the Intel Core Duo Processor," May 15, 2006, pp. 109-122.

Anoop Iyer, et al., "Power and Performance Evaluation of Globally Asynchronous Locally Synchronous Processors," 2002, pp. 1-11.

Greg Semeraro, et al., "Hiding Synchronization Delays in A GALS Processor Microarchitecture," 2004, pp. 1-11.

Joan-Manuel Parcerisa, et al., "Efficient Interconnects for Clustered Microarchitectures," 2002, pp. 1-10.

Grigorios Magklis, et al., "Profile-Based Dynamic Voltage and Frequency Scalling for a Multiple Clock Domain Microprocessor," 2003, pp. 1-12.

Greg Semeraro, et al., "Dynamic Frequency and Voltage Control for a Multiple Clock Domain Architecture," 2002, pp. 1-12.

Greg Semeraro, "Energy-Efficient Processor Design Using Multiple Clock Domains with Dynamic Voltage and Frequency Scaling," 2002, pp. 29-40.

Diana Marculescu, "Application Adaptive Energy Efficient Clustered Architectures," 2004, pp. 344-349.

L. Benini, et al., "System-Level Dynamic Power Management," 1999, pp. 23-31.

Ravindra Jejurikar, et al., "Leakage Aware Dynamic Voltage Scaling for Real-Time Embedded Systems," 2004, pp. 275-280.

Ravindra Jejurikar, et al., "Dynamic Slack Reclamation With Procrastination Scheduling in Real-Time Embedded Systems," 2005, pp. 13-17.

R. Todling, et al., "Some Strategies for Kalman Filtering and Smoothing," 1996, pp. 1-21.

R.E. Kalman, "A New Approach to Linear Filtering and Prediction Problems," 1960, pp. 1-12.

Intel Corporation, "Intel 64 and IA-32 Architectures Software Developer's Manual," vol. 3 (3A, 3B & 3C): System Programming Guide, Feb. 2014, Chapter 14 Power and Thermal Management (14.1-14.9.5), 44 pages.

Intel Corporation, "Intel 64 and IA-32 Architectures Software Developer's Manual," vol. 3B: System Programming Guide, Part 2, Apr. 2016, Chapter 14 Power and Thermal Management (14.1-14.9.5), 42 pages.

U.S. Appl. No. 15/599,587, filed May 19, 2017, entitled "System, Apparatus and Method for Performing In-Field Self-Testing of a Processor," by Alexander Gendler, et al.

Intel Corporation. Intel Go, "Product Brief, Intel Go Autonomous Driving Solutions, Autonomous Driving, Accelerated," Feb. 2017, 6 pages.

* cited by examiner

SYSTEM, APPARATUS AND METHOD FOR IN-FIELD SELF TESTING IN A DIAGNOSTIC SLEEP STATE

This application is a continuation of U.S. patent application Ser. No. 15/825,352, filed Nov. 29, 2017, the content of which is hereby incorporated by reference.

TECHNICAL FIELD

Embodiments relate to a processor having self testing capabilities.

BACKGROUND

Electronic devices such as integrated circuits used in automotive systems are required to meet certain functional safety requirements. The goal of these requirements is to remove unreasonable risk of harm due to hazards caused by malfunctioning behavior. The International Organization For Standards (ISO) ISO 26262 standard for functional safety of electrical/electronic systems in automobiles defines these requirements and classifies 4 distinct levels of safety, ranging from Automotive Safety Integrity Level (ASIL)-A (lightest requirements) to ASIL-D (most stringent requirements).

In order to meet these safety and integrity goals, in-field diagnostics may use built in self test circuitry of a processor. Nevertheless it is difficult and time consuming to perform such testing, and it can adversely impact normal operation. In many cases, such testing cannot be performed during normal system operation.

DETAILED DESCRIPTION

Figure 1:
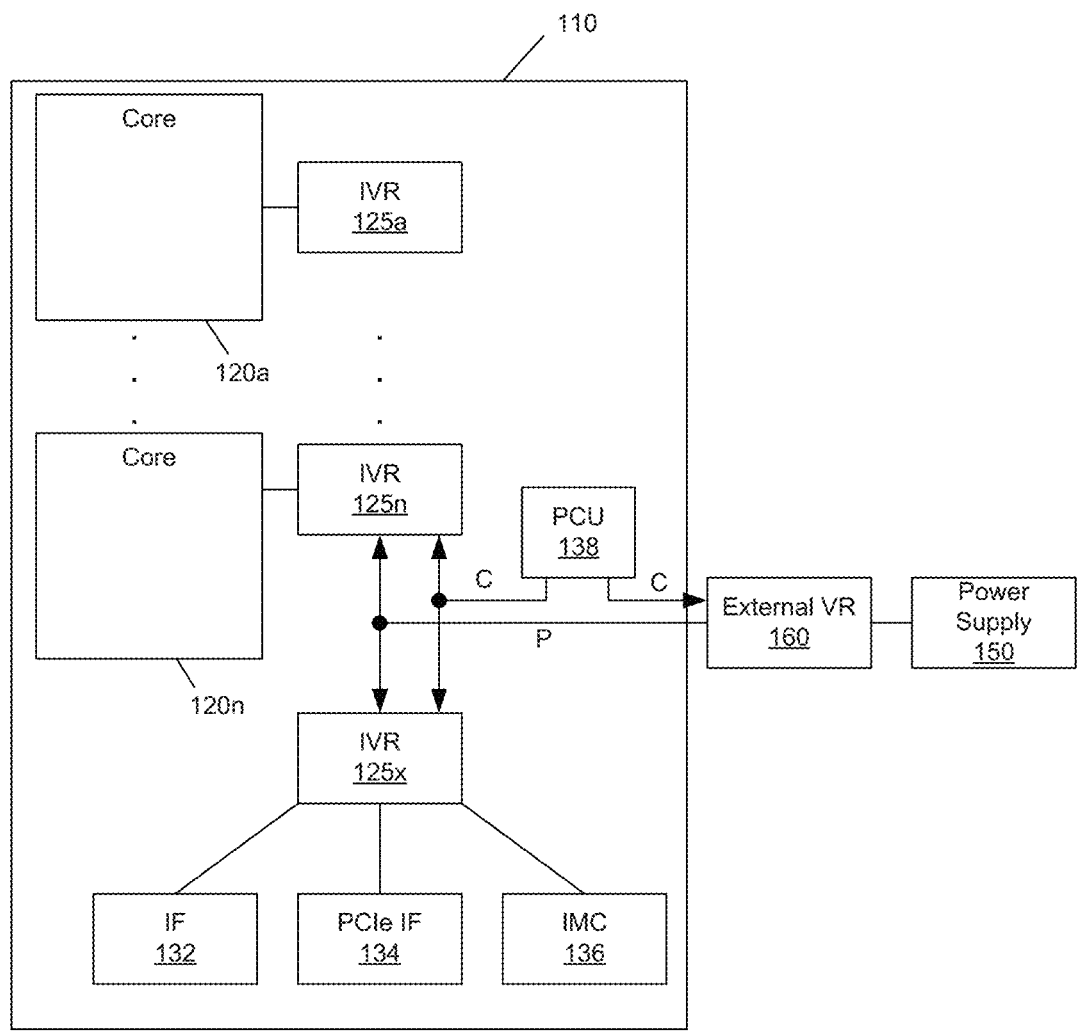
FIG. 1 is a block diagram of a portion of a system in accordance with an embodiment of the present invention.

In various embodiments, techniques are provided to enable a processor or other integrated circuit to perform in-field self testing during normal system operation in a manner that is non-destructive to a current state of the processor. To this end, embodiments provide a diagnostic sleep state in which in-field diagnostic testing may be performed. Before entry to this state, a processor (e.g., via microcode) saves away state of the core. When the core has entered the diagnostic sleep state, a test controller such as a scan finite state machine (FSM) is triggered to perform in-field scan testing of logic of the core. Following completion, the test controller triggers a localized core reset and wakes the core. On wakeup from this diagnostic sleep state, the core (e.g., via microcode) restores the core's state.

In an embodiment this in-field self testing may be performed using a test pattern module, which is an encrypted and signed binary that is used to package one or more scan or other test patterns. A given core may execute microcode to authenticate and decrypt this binary, and load it into a cache memory. The test controller may use a direct access testing (DAT) mechanism to access the cache memory and to read the patterns and shift them into scan chains or other test circuitry of a processor. In another embodiment the test controller may access the patterns using a conventional read/write interface to the cache memory.

Using an embodiment, the need for an external controller to enable self testing via a test access port (TAP) is avoided. In addition to reducing component count, security issues raised by such external test controller are also avoided. An external controller conventionally performs testing in a manner that is completely destructive to the processor state, requiring a complete processor reboot following testing, which also may be avoided using an embodiment.

With an embodiment, microcode patch authentication and decryption circuitry and cryptographic micro-operations of a core can be used to perform test pattern module authentication and decryption. In addition, embodiments leverage a cache memory to store test patterns. In this way, an external non-volatile memory in which these test patterns persist may be of any given technology as the test operation is agnostic to the non-volatile memory technology. And with a diagnostic sleep state in which processor state is saved to and restored from a low power memory, there is no need to restart software following test completion. As embodiments perform self testing in a non-destructive manner, such testing can be performed periodically during normal functional operation. As an example, software may select a module to test and carry out the test while other modules of the processor continue in normal functional operation.

In an embodiment, test pattern modules can be received in the field, such as by over-the-air download, and can be saved by an operating system/basic input/output system (OS/ BIOS) into a given storage. In some cases, tests can be split into multiple groups. Then during testing a test controller can select one or more groups of tests to run, such that functional execution can occur in between periodic execution of these test pattern modules. As such, embodiments provide a low cost, flexible, low latency and non-destructive in-field diagnostic framework.

Although the following embodiments are described with reference to specific integrated circuits, such as in computing platforms or processors, other embodiments are applicable to other types of integrated circuits and logic devices. Similar techniques and teachings of embodiments described herein may be applied to other types of circuits or semiconductor devices that may also benefit from better energy efficiency and energy conservation. For example, the disclosed embodiments are not limited to any particular type of computer systems. That is, disclosed embodiments can be used in many different system types, ranging from server computers (e.g., tower, rack, blade, micro-server and so forth), communications systems, storage systems, desktop computers of any configuration, laptop, notebook, and tablet computers (including 2:1 tablets, phablets and so forth), and may be also used in other devices, such as handheld devices, systems on chip (SoCs), and embedded applications. Some examples of handheld devices include cellular phones such as smartphones, Internet protocol devices, digital cameras, personal digital assistants (PDAs), and handheld PCs. Embedded applications may typically include a microcontroller, a digital signal processor (DSP), network computers (NetPC), set-top boxes, network hubs, wide area network (WAN) switches, wearable devices, or any other system that can perform the functions and operations taught below. More so, embodiments may be implemented in mobile terminals having standard voice functionality such as mobile phones, smartphones and phablets, and/or in non-mobile terminals without a standard wireless voice function communication capability, such as many wearables, tablets, notebooks, desktops, micro-servers, servers and so forth. Moreover, the apparatuses, methods, and systems described herein are not limited to physical computing devices, but may also relate to software optimizations.

Referring now to FIG. 1, shown is a block diagram of a portion of a system in accordance with an embodiment of the present invention. As shown in FIG. 1, system 100 may include various components, including a processor 110 which as shown is a multicore processor. Processor 110 may be coupled to a power supply 150 via an external voltage regulator 160, which may perform a first voltage conversion to provide a primary regulated voltage to processor 110.

As seen, processor 110 may be a single die processor including multiple cores $120_a$-$120_n$. In addition, each core may be associated with an integrated voltage regulator (IVR) $125_a$-$125_n$ which receives the primary regulated voltage and generates an operating voltage to be provided to one or more agents of the processor associated with the IVR. Accordingly, an IVR implementation may be provided to allow for fine-grained control of voltage and thus power and performance of each individual core. As such, each core can operate at an independent voltage and frequency, enabling great flexibility and affording wide opportunities for balancing power consumption with performance. In some embodiments, the use of multiple IVRs enables the grouping of components into separate power planes, such that power is regulated and supplied by the IVR to only those components in the group. During power management, a given power plane of one IVR may be powered down or off when the processor is placed into a certain low power state, while another power plane of another IVR remains active, or fully powered.

Still referring to FIG. 1, additional components may be present within the processor including an input/output interface 132, another interface 134, and an integrated memory controller 136. As seen, each of these components may be powered by another integrated voltage regulator $125_x$. In one embodiment, interface 132 may be enable operation for an Intel® Quick Path Interconnect (QPI) interconnect, which provides for point-to-point (PtP) links in a cache coherent protocol that includes multiple layers including a physical layer, a link layer and a protocol layer. In turn, interface 134 may communicate via a Peripheral Component Interconnect Express (PCIe™) protocol.

Also shown is a power control unit (PCU) 138, which may include hardware, software and/or firmware to perform power management operations with regard to processor 110. As seen, PCU 138 provides control information to external voltage regulator 160 via a digital interface to cause the voltage regulator to generate the appropriate regulated voltage. PCU 138 also provides control information to IVRs 125 via another digital interface to control the operating voltage generated (or to cause a corresponding IVR to be disabled in a low power mode). In various embodiments, PCU 138 may include a variety of power management logic units to perform hardware-based power management. Such power management may be wholly processor controlled (e.g., by various processor hardware, and which may be triggered by workload and/or power, thermal or other processor constraints) and/or the power management may be performed responsive to external sources (such as a platform or management power management source or system software).

In embodiments herein, PCU 138 may be configured to control entry into in-field self-testing of various cores and logic. As discussed herein, in some cases PCU 138 may trigger such diagnostic testing for a given core in connection with a low power state entry such that the given core is isolated from other cores and circuitry of processor 110. In turn, the results of such testing may be sent to one or more destinations.

While not shown for ease of illustration, understand that additional components may be present within processor 110 such as uncore logic, and other components such as internal memories, e.g., one or more levels of a cache memory hierarchy and so forth. Furthermore, while shown in the implementation of FIG. 1 with an integrated voltage regulator, embodiments are not so limited.

Processors described herein may leverage power management techniques that may be independent of and complementary to an operating system (OS)-based power management (OSPM) mechanism. According to one example OSPM technique, a processor can operate at various performance states or levels, so-called P-states, namely from P0 to PN. In general, the P1 performance state may correspond to the highest guaranteed performance state that can be requested by an OS. In addition to this P1 state, the OS can further request a higher performance state, namely a P0 state. This P0 state may thus be an opportunistic or turbo mode state in which, when power and/or thermal budget is available, processor hardware can configure the processor or at least portions thereof to operate at a higher than guaranteed frequency. In many implementations a processor can include multiple so-called bin frequencies above the P1 guaranteed maximum frequency, exceeding to a maximum peak frequency of the particular processor, as fused or otherwise written into the processor during manufacture. In addition, according to one OSPM mechanism, a processor can operate at various power states or levels. With regard to power states, an OSPM mechanism may specify different power consumption states, generally referred to as C-states, C0, C1 to Cn states. When a core is active, it runs at a C0 state, and when the core is idle it may be placed in a core low power state, also called a core non-zero C-state (e.g., C1-C6 states), with each C-state being at a lower power consumption level (such that C6 is a deeper low power state than C1, and so forth).

Understand that many different types of power management techniques may be used individually or in combination in different embodiments. As representative examples, a power controller may control the processor to be power managed by some form of dynamic voltage frequency scaling (DVFS) in which an operating voltage and/or operating frequency of one or more cores or other processor logic may be dynamically controlled to reduce power consumption in certain situations. In an example, DVFS may be performed using Enhanced Intel SpeedStep™ technology available from Intel Corporation, Santa Clara, Calif., to provide optimal performance at a lowest power consumption level. In another example, DVFS may be performed using Intel TurboBoost™ technology to enable one or more cores or other compute engines to operate at a higher than guaranteed operating frequency based on conditions (e.g., workload and availability).

Another power management technique that may be used in certain examples is dynamic swapping of workloads between different compute engines. For example, the processor may include asymmetric cores or other processing engines that operate at different power consumption levels, such that in a power constrained situation, one or more workloads can be dynamically switched to execute on a lower power core or other compute engine. Another exemplary power management technique is hardware duty cycling (HDC), which may cause cores and/or other compute engines to be periodically enabled and disabled according to a duty cycle, such that one or more cores may be made inactive during an inactive period of the duty cycle and made active during an active period of the duty cycle.

Figure 2:
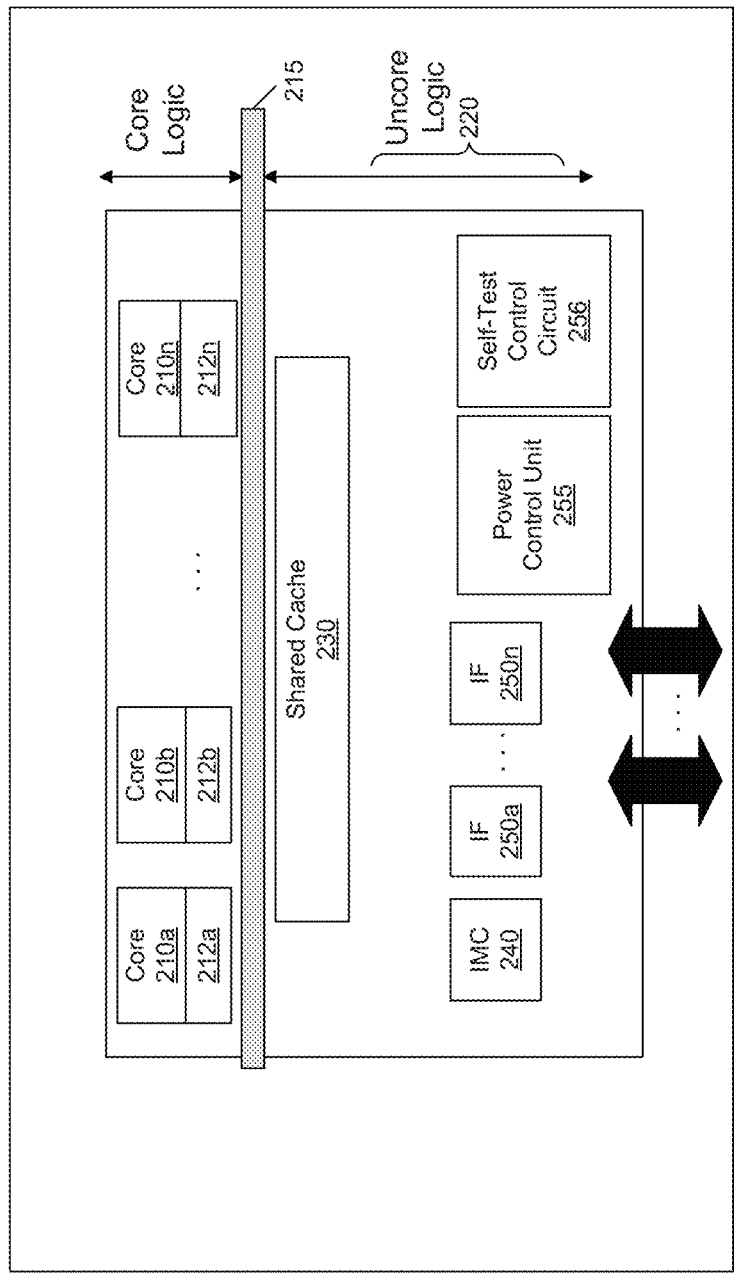
FIG. 2 is a block diagram of a processor in accordance with an embodiment of the present invention.

Embodiments can be implemented in processors for various markets including server processors, desktop processors, mobile processors and so forth. Referring now to FIG. 2, shown is a block diagram of a processor in accordance with an embodiment of the present invention. As shown in FIG. 2, processor 200 may be a multicore processor including a plurality of cores $210_a$-$210_n$. In one embodiment, each such core may be of an independent power domain and can be configured to enter and exit active states and/or maximum performance states based on workload. Each core 210 may be associated with a corresponding core perimeter logic 212a-212n. In general, core perimeter logic 212 may include one or more independent power/frequency domains that provide an interface between core circuitry and a remainder of the processor. Notably, one or more independent storage units of each core perimeter logic 212 may be adapted to store at least certain context information of the associated core to enable fast entry into and exit from particular low power states and to further enable certain processor operations (such as interrupt handling and snoop responses) to occur while a corresponding core is in a low power state. In addition, such perimeter logic 212 may provide interrupt information while core 210 is in a low power state, to enable faster low power state exits when a given core is targeted by an interrupt.

The various cores may be coupled via an interconnect 215 to a system agent or uncore 220 that includes various components. As seen, the uncore 220 may include a shared cache 230 which may be a last level cache. In addition, the uncore may include an integrated memory controller 240 to communicate with a system memory (not shown in FIG. 2), e.g., via a memory bus. Uncore 220 also includes various interfaces 250 and a power control unit 255, which may include logic to perform power management techniques as described herein. In addition, a self-test control circuit 256 may be configured to identify an appropriate core (or group of cores) to place into a diagnostic sleep state to perform in-field self-testing.

In addition, by interfaces 250a-250n, connection can be made to various off-chip components such as peripheral devices, mass storage and so forth. While shown with this particular implementation in the embodiment of FIG. 2, the scope of the present invention is not limited in this regard.

Figure 3:
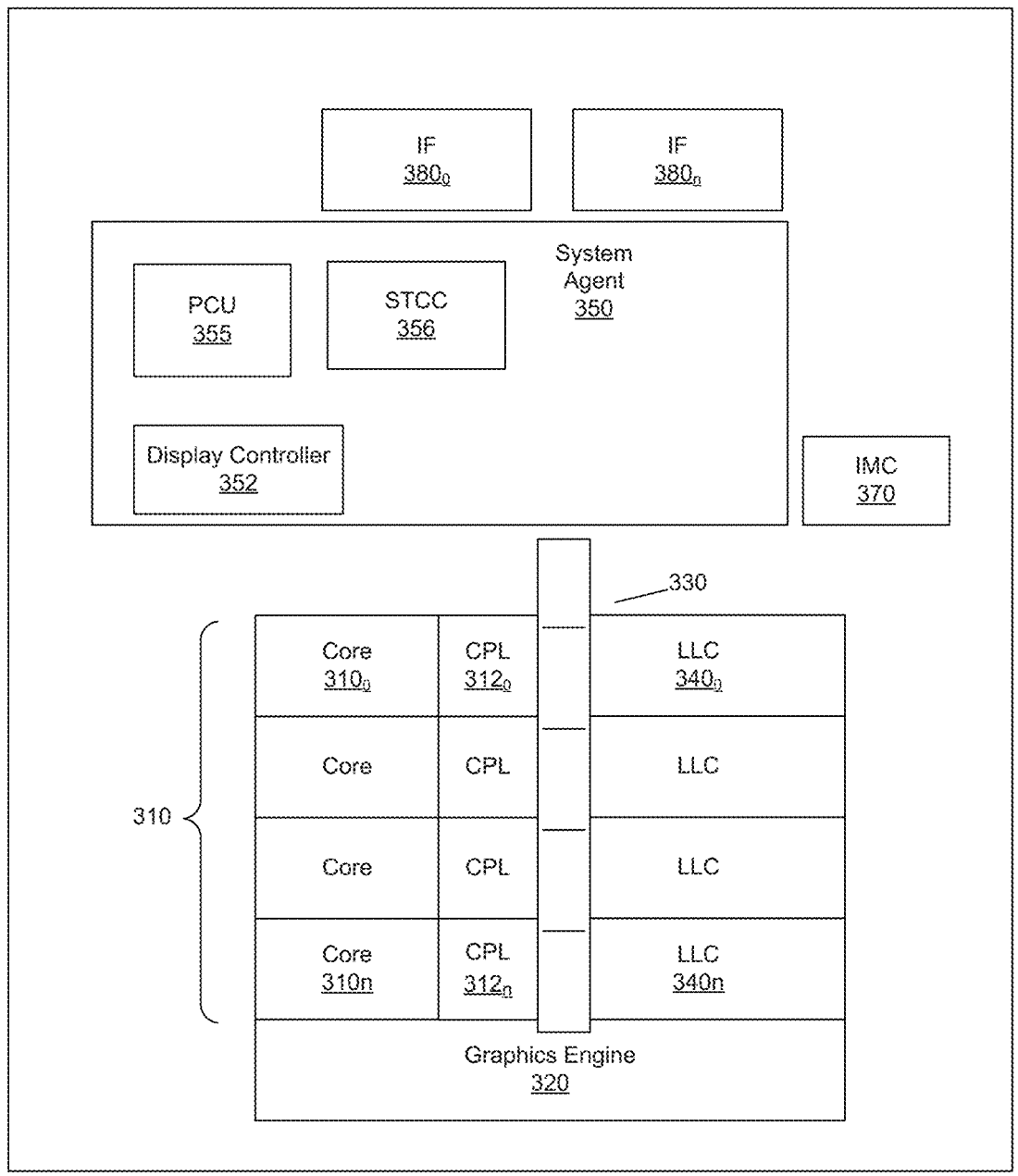
FIG. 3 is a block diagram of a multi-domain processor in accordance with another embodiment of the present invention.

Referring now to FIG. 3, shown is a block diagram of a multi-domain processor in accordance with another embodiment of the present invention. As shown in the embodiment of FIG. 3, processor 300 includes multiple domains. Specifically, a core domain 310 can include a plurality of cores $310_0$-$310_n$, a graphics domain 320 can include one or more graphics engines, and a system agent domain 350 may further be present. In some embodiments, system agent domain 350 may execute at an independent frequency than the core domain and may remain powered on at all times to handle power control events and power management such that domains 310 and 320 can be controlled to dynamically enter into and exit high power and low power states. Each of domains 310 and 320 may operate at different voltage and/or power. Note that while only shown with three domains, understand the scope of the present invention is not limited in this regard and additional domains can be present in other embodiments. For example, multiple core domains may be present each including at least one core.

In general, each core 310 may further include low level caches in addition to various execution units and additional processing elements. In turn, the various cores may be coupled to each other and to a shared cache memory formed of a plurality of units of a last level cache (LLC) $340_0$-$340_n$. In various embodiments, LLC 340 may be shared amongst the cores and the graphics engine, as well as various media processing circuitry. As seen, a ring interconnect 330 thus couples the cores together, and provides interconnection between the cores, graphics domain 320 and system agent circuitry 350. In one embodiment, interconnect 330 can be part of the core domain. However in other embodiments the ring interconnect can be of its own domain. As further shown, a plurality of core perimeter logics $312_0$-$312_n$ each may be associated with a given core and may provide for efficient storage and retrieval of context information, e.g., as used during low power entry and exit situations. In the illustration of FIG. 3, core perimeter logic 312 is shown coupled between a corresponding core 310 and ring interconnect 330, and may further be used to provide information for use in identifying a target core for an interrupt, while the core is in a low power state. However understand that direct connection between core 310 and ring interconnect 330 may be present, along with corresponding direct connection between core perimeter logic 312 and ring interconnect 330, in some embodiments.

As further seen, system agent domain 350 may include display controller 352 which may provide control of and an interface to an associated display. As further seen, system agent domain 350 may include a power control unit 355 which can include logic to perform power management techniques. And a self-test control circuit 356 may be used to schedule and control in-field self-testing of given cores while the core is isolated from other circuitry of processor 300 in a diagnostic sleep state (such that this core appears to core-external circuitry as being in a low power state).

As further seen in FIG. 3, processor 300 can further include an integrated memory controller (IMC) 370 that can provide for an interface to a system memory, such as a dynamic random access memory (DRAM). Multiple interfaces $380_0$-$380_n$ may be present to enable interconnection between the processor and other circuitry. For example, in one embodiment at least one direct media interface (DMI) interface may be provided as well as one or more PCIe™ interfaces. Still further, to provide for communications between other agents such as additional processors or other circuitry, one or more QPI interfaces may also be provided. Although shown at this high level in the embodiment of FIG. 3, understand the scope of the present invention is not limited in this regard.

Figure 4:
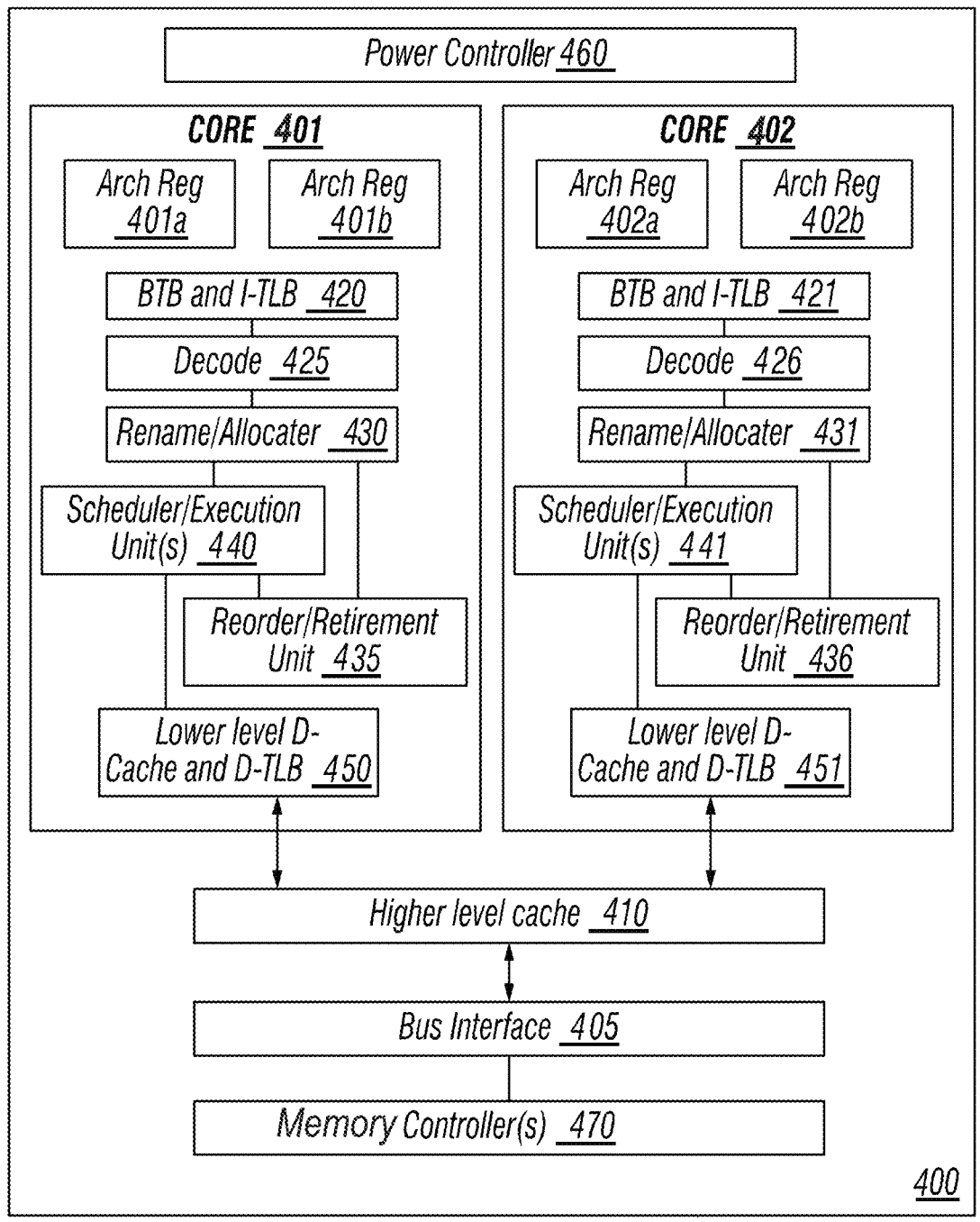
FIG. 4 is an embodiment of a processor including multiple cores.

Referring to FIG. 4, an embodiment of a processor including multiple cores is illustrated. Processor 400 includes any processor or processing device, such as a microprocessor, an embedded processor, a digital signal processor (DSP), a network processor, a handheld processor, an application processor, a co-processor, a system on a chip (SoC), or other device to execute code. Processor 400, in one embodiment, includes at least two cores—cores 401 and 402, which may include asymmetric cores or symmetric cores (the illustrated embodiment). However, processor 400 may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor typically refers to an integrated circuit, which potentially includes any number of other processing elements, such as cores or hardware threads.

A core often refers to logic located on an integrated circuit capable of maintaining an independent architectural state, wherein each independently maintained architectural state is associated with at least some dedicated execution resources. In contrast to cores, a hardware thread typically refers to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 400, as illustrated in FIG. 4, includes two cores, cores 401 and 402. Here, cores 401 and 402 are considered symmetric cores, i.e., cores with the same configurations, functional units, and/or logic. In another embodiment, core 401 includes an out-of-order processor core, while core 402 includes an in-order processor core. However, cores 401 and 402 may be individually selected from any type of core, such as a native core, a software managed core, a core adapted to execute a native instruction set architecture (ISA), a core adapted to execute a translated ISA, a co-designed core, or other known core. Yet to further the discussion, the functional units illustrated in core 401 are described in further detail below, as the units in core 402 operate in a similar manner.

As depicted, core 401 includes two hardware threads 401a and 401b, which may also be referred to as hardware thread slots 401a and 401b. Therefore, software entities, such as an operating system, in one embodiment potentially view processor 400 as four separate processors, i.e., four logical processors or processing elements capable of executing four software threads concurrently. As alluded to above, a first thread is associated with architecture state registers 401a, a second thread is associated with architecture state registers 401b, a third thread may be associated with architecture state registers 402a, and a fourth thread may be associated with architecture state registers 402b. Here, each of the architecture state registers (401a, 401b, 402a, and 402b) may be referred to as processing elements, thread slots, or thread units, as described above. As illustrated, architecture state registers 401a are replicated in architecture state registers 401b, so individual architecture states/contexts are capable of being stored for logical processor 401a and logical processor 401b. In core 401, other smaller resources, such as instruction pointers and renaming logic in allocator and renamer block 430 may also be replicated for threads 401a and 401b. Some resources, such as re-order buffers in reorder/retirement unit 435, ILTB 420, load/store buffers, and queues may be shared through partitioning. Other resources, such as general purpose internal registers, page-table base register(s), low-level data-cache and data-TLB 415, execution unit(s) 440, and portions of out-of-order unit 435 are potentially fully shared.

Processor 400 often includes other resources, which may be fully shared, shared through partitioning, or dedicated by/to processing elements. In FIG. 4, an embodiment of a purely exemplary processor with illustrative logical units/resources of a processor is illustrated. Note that a processor may include, or omit, any of these functional units, as well as include any other known functional units, logic, or firmware not depicted. As illustrated, core 401 includes a simplified, representative out-of-order (OOO) processor core. But an in-order processor may be utilized in different embodiments. The OOO core includes a branch target buffer 420 to predict branches to be executed/taken and an instruction-translation buffer (I-TLB) 420 to store address translation entries for instructions.

Core 401 further includes decode module 425 coupled to fetch unit 420 to decode fetched elements. Fetch logic, in one embodiment, includes individual sequencers associated with thread slots 401a, 401b, respectively. Usually core 401 is associated with a first ISA, which defines/specifies instructions executable on processor 400. Often machine code instructions that are part of the first ISA include a portion of the instruction (referred to as an opcode), which references/specifies an instruction or operation to be performed. Decode logic 425 includes circuitry that recognizes these instructions from their opcodes and passes the decoded instructions on in the pipeline for processing as defined by the first ISA. For example, decoders 425, in one embodiment, include logic designed or adapted to recognize specific instructions, such as transactional instruction. As a result of the recognition by decoders 425, the architecture or core 401 takes specific, predefined actions to perform tasks associated with the appropriate instruction. It is important to note that any of the tasks, blocks, operations, and methods described herein may be performed in response to a single or multiple instructions; some of which may be new or old instructions.

In one example, allocator and renamer block 430 includes an allocator to reserve resources, such as register files to store instruction processing results. However, threads 401a and 401b are potentially capable of out-of-order execution, where allocator and renamer block 430 also reserves other resources, such as reorder buffers to track instruction results. Unit 430 may also include a register renamer to rename program/instruction reference registers to other registers internal to processor 400. Reorder/retirement unit 435 includes components, such as the reorder buffers mentioned above, load buffers, and store buffers, to support out-of-order execution and later in-order retirement of instructions executed out-of-order.

Scheduler and execution unit(s) block 440, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation buffer (D-TLB) 450 are coupled to execution unit(s) 440. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages.

Here, cores 401 and 402 share access to higher-level or further-out cache 410, which is to cache recently fetched elements. Note that higher-level or further-out refers to cache levels increasing or getting further away from the execution unit(s). In one embodiment, higher-level cache 410 is a last-level data cache—last cache in the memory hierarchy on processor 400—such as a second or third level data cache. However, higher level cache 410 is not so limited, as it may be associated with or includes an instruction cache. A trace cache—a type of instruction cache—instead may be coupled after decoder 425 to store recently decoded traces.

In the depicted configuration, processor 400 also includes bus interface module 405 and a power controller 460, which may perform power management in accordance with an embodiment of the present invention. In this scenario, bus interface 405 is to communicate with devices external to processor 400, such as system memory and other components.

A memory controller 470 may interface with other devices such as one or many memories. In an example, bus interface 405 includes a ring interconnect with a memory controller for interfacing with a memory and a graphics controller for interfacing with a graphics processor. In an SoC environment, even more devices, such as a network interface, coprocessors, memory, graphics processor, and any other known computer devices/interface may be integrated on a single die or integrated circuit to provide small form factor with high functionality and low power consumption.

Figure 5:
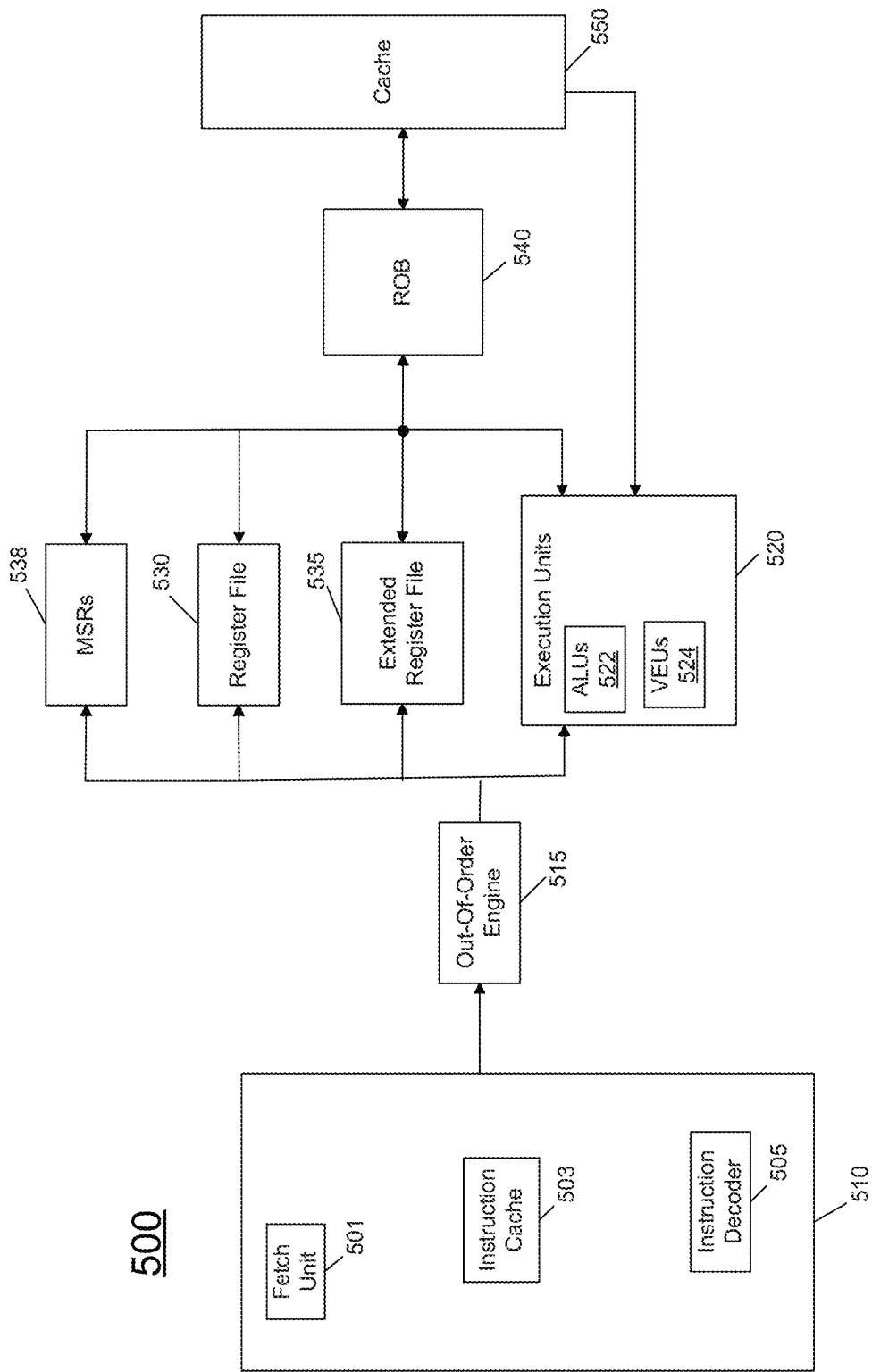
FIG. 5 is a block diagram of a micro-architecture of a processor core in accordance with one embodiment of the present invention.

Referring now to FIG. 5, shown is a block diagram of a micro-architecture of a processor core in accordance with one embodiment of the present invention. As shown in FIG. 5, processor core 500 may be a multi-stage pipelined out-of-order processor. Core 500 may operate at various voltages based on a received operating voltage, which may be received from an integrated voltage regulator or external voltage regulator.

As seen in FIG. 5, core 500 includes front end units 510, which may be used to fetch instructions, including an in-field self test instruction as described herein, to be executed and prepare them for use later in the processor pipeline. For example, front end units 510 may include a fetch unit 501, an instruction cache 503, and an instruction decoder 505. In some implementations, front end units 510 may further include a trace cache, along with microcode storage as well as a micro-operation storage. Fetch unit 501 may fetch macro-instructions, e.g., from memory or instruction cache 503, and feed them to instruction decoder 505 to decode them into primitives, i.e., micro-operations for execution by the processor.

Coupled between front end units 510 and execution units 520 is an out-of-order (OOO) engine 515 that may be used to receive the micro-instructions and prepare them for execution. More specifically OOO engine 515 may include various buffers to re-order micro-instruction flow and allocate various resources needed for execution, as well as to provide renaming of logical registers onto storage locations within various register files such as register file 530 and extended register file 535. Register file 530 may include separate register files for integer and floating point operations. For purposes of configuration, control, and additional operations, a set of machine specific registers (MSRs) 538 may also be present and accessible to various logic within core 500 (and external to the core). For example, power limit information may be stored in one or more MSR and be dynamically updated as described herein.

Various resources may be present in execution units 520, including, for example, various integer, floating point, and single instruction multiple data (SIMD) logic units, among other specialized hardware. For example, such execution units may include one or more arithmetic logic units (ALUs) 522 and one or more vector execution units 524, among other such execution units.

Results from the execution units may be provided to retirement logic, namely a reorder buffer (ROB) 540. More specifically, ROB 540 may include various arrays and logic to receive information associated with instructions that are executed. This information is then examined by ROB 540 to determine whether the instructions can be validly retired and result data committed to the architectural state of the processor, or whether one or more exceptions occurred that prevent a proper retirement of the instructions. Of course, ROB 540 may handle other operations associated with retirement.

As shown in FIG. 5, ROB 540 is coupled to a cache 550 which, in one embodiment may be a low level cache (e.g., an L1 cache) although the scope of the present invention is not limited in this regard. Also, execution units 520 can be directly coupled to cache 550. From cache 550, data communication may occur with higher level caches, system memory and so forth. While shown with this high level in the embodiment of FIG. 5, understand the scope of the present invention is not limited in this regard. For example, while the implementation of FIG. 5 is with regard to an out-of-order machine such as of an Intel® x86 instruction set architecture (ISA), the scope of the present invention is not limited in this regard. That is, other embodiments may be implemented in an in-order processor, a reduced instruction set computing (RISC) processor such as an ARM-based processor, or a processor of another type of ISA that can emulate instructions and operations of a different ISA via an emulation engine and associated logic circuitry.

Figure 6:
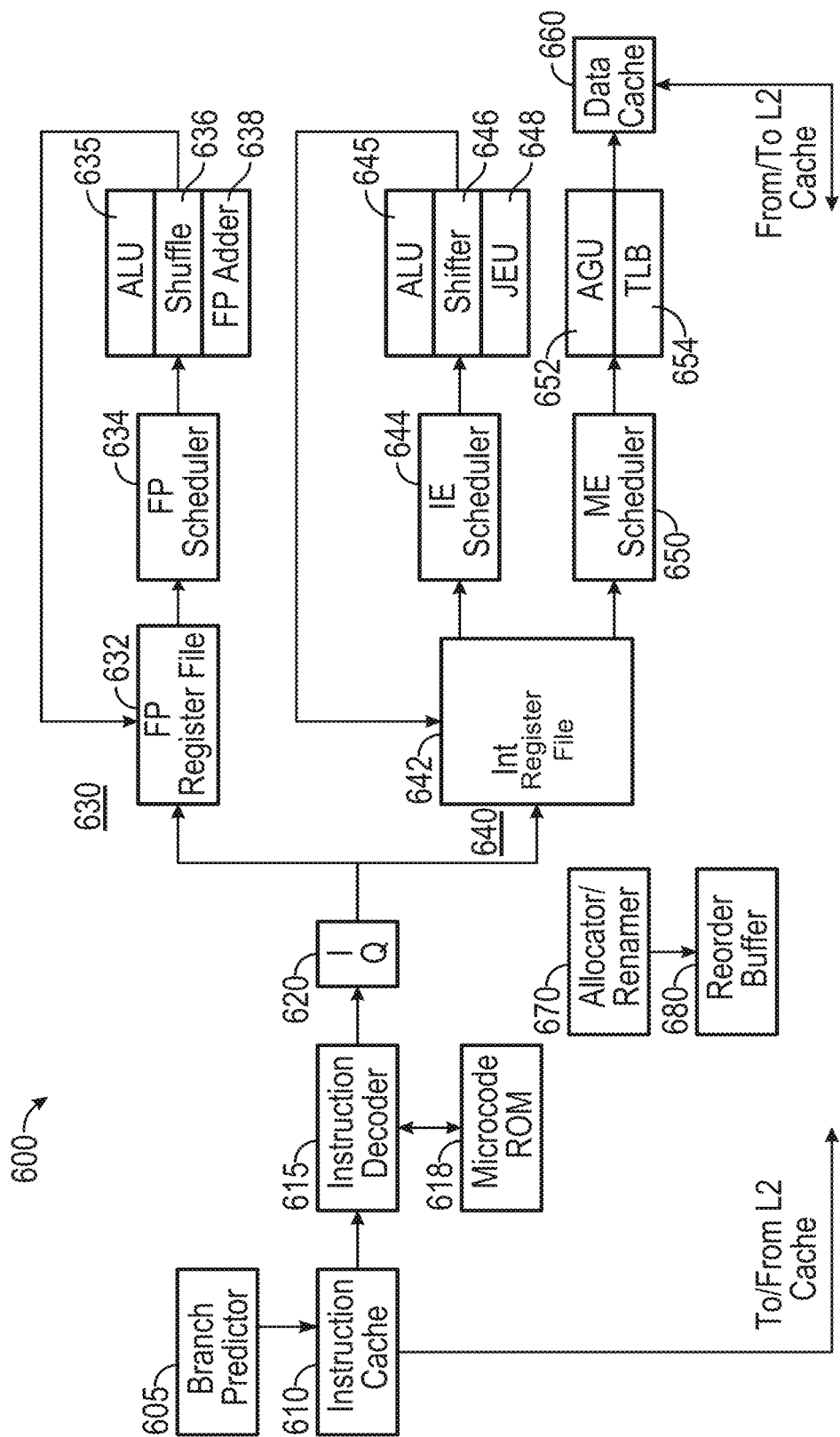
FIG. 6 is a block diagram of a micro-architecture of a processor core in accordance with another embodiment.

Referring now to FIG. 6, shown is a block diagram of a micro-architecture of a processor core in accordance with another embodiment. In the embodiment of FIG. 6, core 600 may be a low power core of a different micro-architecture, such as an Intel® Atom™-based processor having a relatively limited pipeline depth designed to reduce power consumption. As seen, core 600 includes an instruction cache 610 coupled to provide instructions, including an in-field self test instruction as described herein, to an instruction decoder 615. A branch predictor 605 may be coupled to instruction cache 610. Note that instruction cache 610 may further be coupled to another level of a cache memory, such as an L2 cache (not shown for ease of illustration in FIG. 6). In turn, instruction decoder 615 provides decoded instructions to an issue queue 620 for storage and delivery to a given execution pipeline. A microcode ROM 618 is coupled to instruction decoder 615.

A floating point pipeline 630 includes a floating point register file 632 which may include a plurality of architectural registers of a given bit with such as 128, 256 or 512 bits. Pipeline 630 includes a floating point scheduler 634 to schedule instructions for execution on one of multiple execution units of the pipeline. In the embodiment shown, such execution units include an ALU 635, a shuffle unit 636, and a floating point adder 638. In turn, results generated in these execution units may be provided back to buffers and/or registers of register file 632. Of course understand while shown with these few example execution units, additional or different floating point execution units may be present in another embodiment.

An integer pipeline 640 also may be provided. In the embodiment shown, pipeline 640 includes an integer register file 642 which may include a plurality of architectural registers of a given bit with such as 128 or 256 bits. Pipeline 640 includes an integer scheduler 644 to schedule instructions for execution on one of multiple execution units of the pipeline. In the embodiment shown, such execution units include an ALU 645, a shifter unit 646, and a jump execution unit 648. In turn, results generated in these execution units may be provided back to buffers and/or registers of register file 642. Of course understand while shown with these few example execution units, additional or different integer execution units may be present in another embodiment.

A memory execution scheduler 650 may schedule memory operations for execution in an address generation unit 652, which is also coupled to a TLB 654. As seen, these structures may couple to a data cache 660, which may be a L0 and/or L1 data cache that in turn couples to additional levels of a cache memory hierarchy, including an L2 cache memory.

To provide support for out-of-order execution, an allocator/renamer 670 may be provided, in addition to a reorder buffer 680, which is configured to reorder instructions executed out of order for retirement in order. Although shown with this particular pipeline architecture in the illustration of FIG. 6, understand that many variations and alternatives are possible.

Note that in a processor having asymmetric cores, such as in accordance with the micro-architectures of FIGS. 5 and 6, workloads may be dynamically swapped between the cores for power management reasons, as these cores, although having different pipeline designs and depths, may be of the same or related ISA. Such dynamic core swapping may be performed in a manner transparent to a user application (and possibly kernel also).

Figure 7:
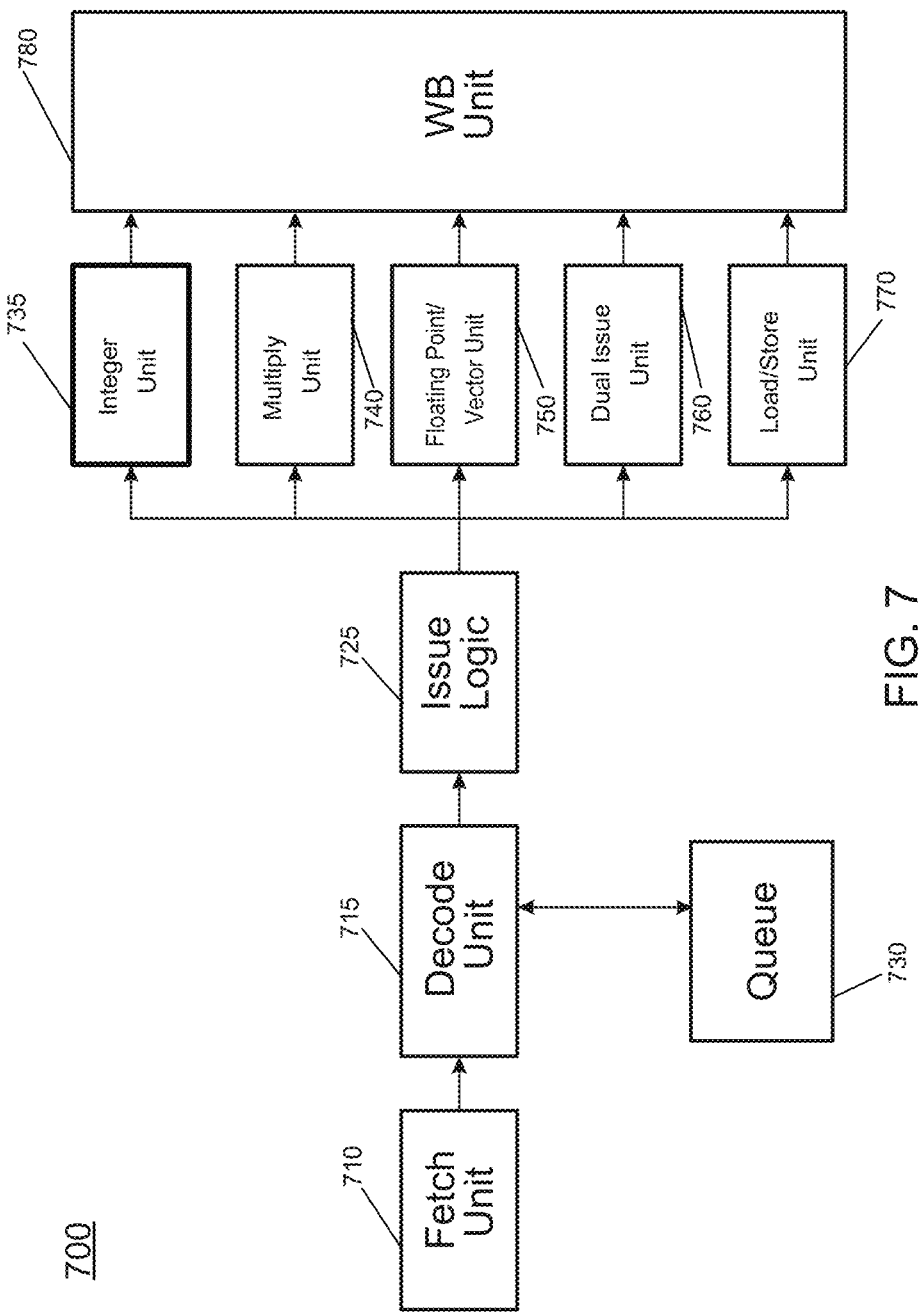
FIG. 7 is a block diagram of a micro-architecture of a processor core in accordance with yet another embodiment.

Referring to FIG. 7, shown is a block diagram of a micro-architecture of a processor core in accordance with yet another embodiment. As illustrated in FIG. 7, a core 700 may include a multi-staged in-order pipeline to execute at very low power consumption levels. As one such example, processor 700 may have a micro-architecture in accordance with an ARM Cortex A53 design available from ARM Holdings, LTD., Sunnyvale, Calif. In an implementation, an 8-stage pipeline may be provided that is configured to execute both 32-bit and 64-bit code. Core 700 includes a fetch unit 710 that is configured to fetch instructions, including an in-field self test instruction as described herein, and provide them to a decode unit 715, which may decode the instructions, e.g., macro-instructions of a given ISA such as an ARMv8 ISA. Note further that a queue 730 may couple to decode unit 715 to store decoded instructions. Decoded instructions are provided to an issue logic 725, where the decoded instructions may be issued to a given one of multiple execution units.

With further reference to FIG. 7, issue logic 725 may issue instructions to one of multiple execution units. In the embodiment shown, these execution units include an integer unit 735, a multiply unit 740, a floating point/vector unit 750, a dual issue unit 760, and a load/store unit 770. The results of these different execution units may be provided to a writeback unit 780. Understand that while a single writeback unit is shown for ease of illustration, in some implementations separate writeback units may be associated with each of the execution units. Furthermore, understand that while each of the units and logic shown in FIG. 7 is represented at a high level, a particular implementation may include more or different structures. A processor designed using one or more cores having a pipeline as in FIG. 7 may be implemented in many different end products, extending from mobile devices to server systems.

Figure 8:
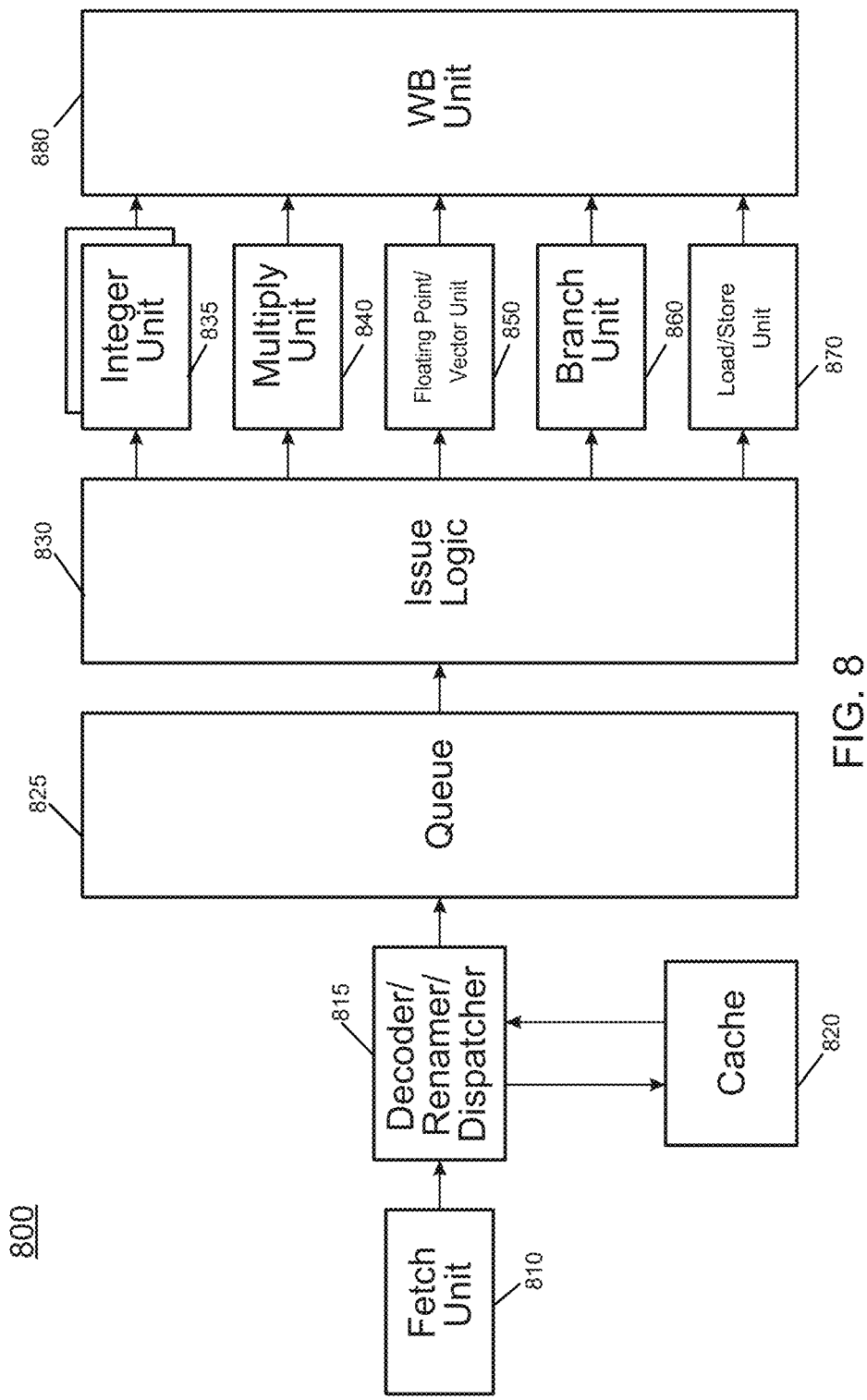
FIG. 8 is a block diagram of a micro-architecture of a processor core in accordance with a still further embodiment.

Referring to FIG. 8, shown is a block diagram of a micro-architecture of a processor core in accordance with a still further embodiment. As illustrated in FIG. 8, a core 800 may include a multi-stage multi-issue out-of-order pipeline to execute at very high performance levels (which may occur at higher power consumption levels than core 700 of FIG. 7). As one such example, processor 800 may have a microarchitecture in accordance with an ARM Cortex A57 design. In an implementation, a 15 (or greater)-stage pipeline may be provided that is configured to execute both 32-bit and 64-bit code. In addition, the pipeline may provide for 3 (or greater)-wide and 3 (or greater)-issue operation. Core 800 includes a fetch unit 810 that is configured to fetch instructions, including an in-field self test instruction as described herein, and provide them to a decoder/renamer/dispatcher 815, which may decode the instructions, e.g., macro-instructions of an ARMv8 instruction set architecture, rename register references within the instructions, and dispatch the instructions (eventually) to a selected execution unit. Decoded instructions may be stored in a queue 825. Note that while a single queue structure is shown for ease of illustration in FIG. 8, understand that separate queues may be provided for each of the multiple different types of execution units.

Also shown in FIG. 8 is an issue logic 830 from which decoded instructions stored in queue 825 may be issued to a selected execution unit. Issue logic 830 also may be implemented in a particular embodiment with a separate issue logic for each of the multiple different types of execution units to which issue logic 830 couples.

Decoded instructions may be issued to a given one of multiple execution units. In the embodiment shown, these execution units include one or more integer units 835, a multiply unit 840, a floating point/vector unit 850, a branch unit 860, and a load/store unit 870. In an embodiment, floating point/vector unit 850 may be configured to handle SIMD or vector data of 128 or 256 bits. Still further, floating point/vector execution unit 850 may perform IEEE-754 double precision floating-point operations. The results of these different execution units may be provided to a writeback unit 880. Note that in some implementations separate writeback units may be associated with each of the execution units. Furthermore, understand that while each of the units and logic shown in FIG. 8 is represented at a high level, a particular implementation may include more or different structures.

Note that in a processor having asymmetric cores, such as in accordance with the micro-architectures of FIGS. 7 and 8, workloads may be dynamically swapped for power management reasons, as these cores, although having different pipeline designs and depths, may be of the same or related ISA. Such dynamic core swapping may be performed in a manner transparent to a user application (and possibly kernel also).

Figure 9:
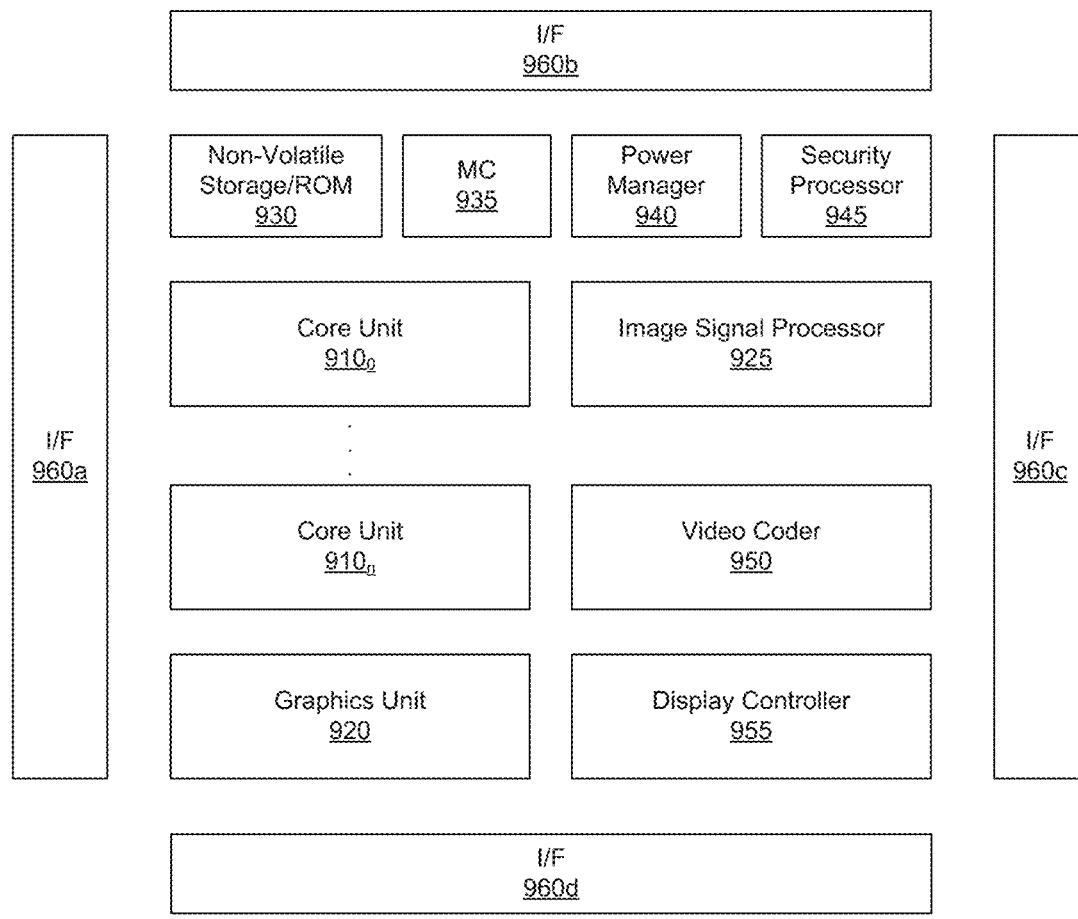
FIG. 9 is a block diagram of a processor in accordance with another embodiment of the present invention.

A processor designed using one or more cores having pipelines as in any one or more of FIGS. 5-8 may be implemented in many different end products, extending from mobile devices to server systems. Referring now to FIG. 9, shown is a block diagram of a processor in accordance with another embodiment of the present invention. In the embodiment of FIG. 9, processor 900 may be a SoC including multiple domains, each of which may be controlled to operate at an independent operating voltage and operating frequency. As a specific illustrative example, processor 900 may be an Intel® Architecture Core™-based processor such as an i3, i5, i7 or another such processor available from Intel Corporation. However, other low power processors such as available from Advanced Micro Devices, Inc. (AMD) of Sunnyvale, Calif., an ARM-based design from ARM Holdings, Ltd. or licensee thereof or a MIPS-based design from MIPS Technologies, Inc. of Sunnyvale, Calif., or their licensees or adopters may instead be present in other embodiments such as an Apple A7 processor, a Qualcomm Snapdragon processor, or Texas Instruments OMAP processor. Such SoC may be used in a low power system such as a smartphone, tablet computer, phablet computer, Ultrabook™ computer or other portable computing device, or a vehicle computing system.

In the high level view shown in FIG. 9, processor 900 includes a plurality of core units $910_0$-$910_n$. Each core unit may include one or more processor cores, one or more cache memories and other circuitry. Each core unit 910 may support one or more instructions sets (e.g., an x86 instruction set (with some extensions that have been added with newer versions); a MIPS instruction set; an ARM instruction set (with optional additional extensions such as NEON)) or other instruction set or combinations thereof. Note that some of the core units may be heterogeneous resources (e.g., of a different design). In addition, each such core may be coupled to a cache memory (not shown) which in an embodiment may be a shared level (L2) cache memory. A non-volatile storage 930 may be used to store various program and other data. For example, this storage may be used to store at least portions of microcode, boot information such as a BIOS, other system software, test patterns for the diagnostic self-testing described herein, or so forth.

Each core unit 910 may also include an interface such as a bus interface unit to enable interconnection to additional circuitry of the processor. In an embodiment, each core unit 910 couples to a coherent fabric that may act as a primary cache coherent on-die interconnect that in turn couples to a memory controller 935. As also described herein, each core unit 910 may include a mailbox interface to enable interaction with a corresponding core perimeter logic (not specifically shown in FIG. 9), to enable enhanced communications and provide for efficient entry into and exit from low power states, among other functions. In turn, memory controller 935 controls communications with a memory such as a DRAM (not shown for ease of illustration in FIG. 9).

In addition to core units, additional processing engines are present within the processor, including at least one graphics unit 920 which may include one or more graphics processing units (GPUs) to perform graphics processing as well as to possibly execute general purpose operations on the graphics processor (so-called GPGPU operation). In addition, at least one image signal processor 925 may be present. Signal processor 925 may be configured to process incoming image data received from one or more capture devices, either internal to the SoC or off-chip.

Other accelerators also may be present. In the illustration of FIG. 9, a video coder 950 may perform coding operations including encoding and decoding for video information, e.g., providing hardware acceleration support for high definition video content. A display controller 955 further may be provided to accelerate display operations including providing support for internal and external displays of a system. In addition, a security processor 945 may be present to perform security operations such as secure boot operations, various cryptography operations and so forth.

Each of the units may have its power consumption controlled via a power manager 940, which may include control logic to perform the various power management techniques described herein, including the control of in-field self-testing of cores while in a diagnostic sleep state.

In some embodiments, SoC 900 may further include a non-coherent fabric coupled to the coherent fabric to which various peripheral devices may couple. One or more interfaces 960a-960d enable communication with one or more off-chip devices. Such communications may be via a variety of communication protocols such as PCIe™, GPIO, USB, I²C, UART, MIPI, SDIO, DDR, SPI, HDMI, among other types of communication protocols. Although shown at this high level in the embodiment of FIG. 9, understand the scope of the present invention is not limited in this regard.

Figure 10:
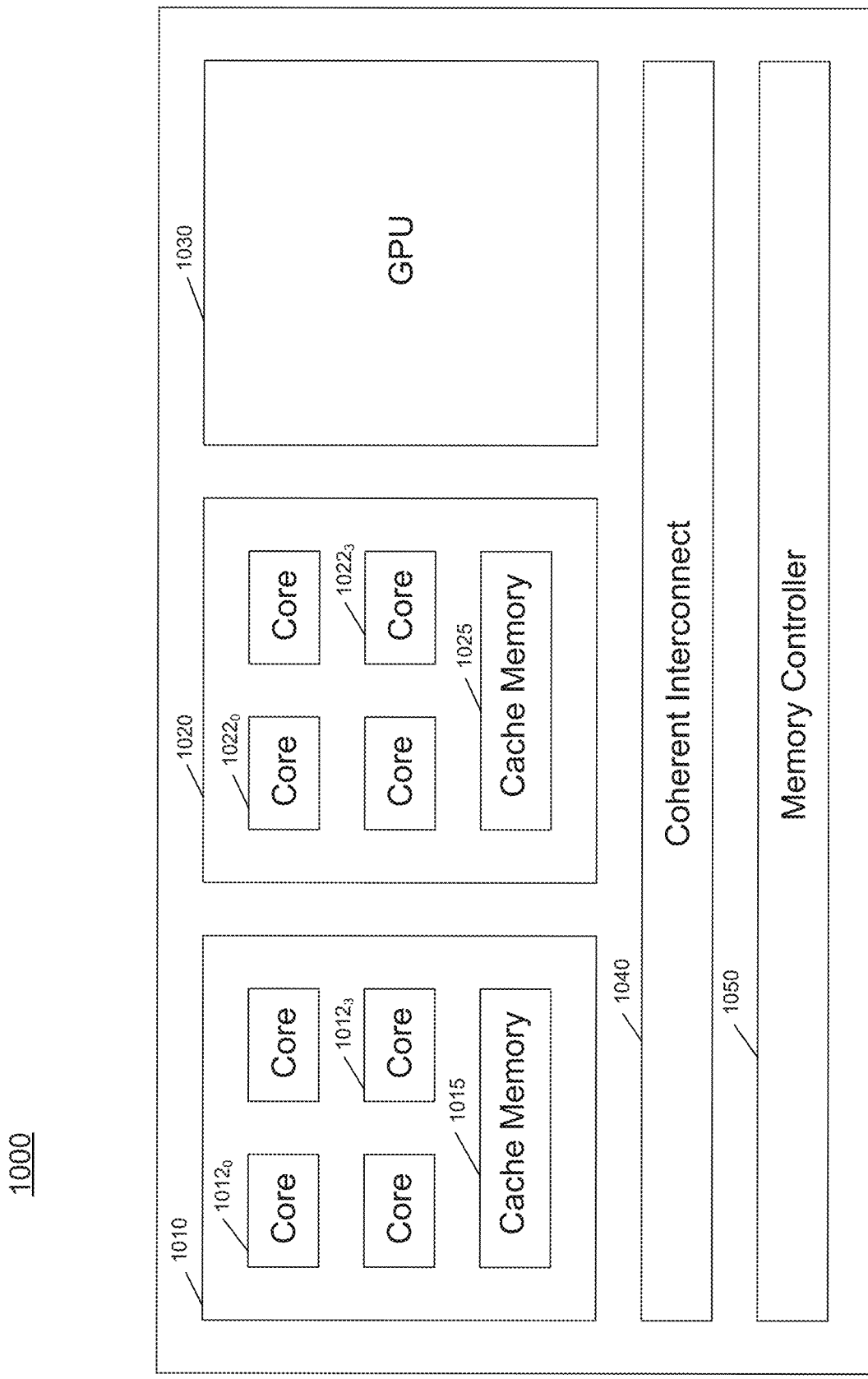
FIG. 10 is a block diagram of a representative SoC in accordance with an embodiment of the present invention.

Referring now to FIG. 10, shown is a block diagram of a representative SoC. In the embodiment shown, SoC 1000 may be a multi-core SoC configured for low power operation to be optimized for incorporation into a smartphone or other low power device such as a tablet computer or other portable computing device or vehicle computing system. As an example, SoC 1000 may be implemented using asymmetric or different types of cores, such as combinations of higher power and/or low power cores, e.g., out-of-order cores and in-order cores. In different embodiments, these cores may be based on an Intel® Architecture™ core design or an ARM architecture design. In yet other embodiments, a mix of Intel and ARM cores may be implemented in a given SoC.

As seen in FIG. 10, SoC 1000 includes a first core domain 1010 having a plurality of first cores $1012_0$-$1012_3$. In an example, these cores may be low power cores such as in-order cores that may interface with corresponding core perimeter logic via a mailbox interface as described herein. In one embodiment these first cores may be implemented as ARM Cortex A53 cores. In turn, these cores couple to a cache memory 1015 of core domain 1010. In addition, SoC 1000 includes a second core domain 1020. In the illustration of FIG. 10, second core domain 1020 has a plurality of second cores $1022_0$-$1022_3$. In an example, these cores may be higher power-consuming cores than first cores 1012. In an embodiment, the second cores may be out-of-order cores, which may be implemented as ARM Cortex A57 cores. In turn, these cores couple to a cache memory 1025 of core domain 1020. Note that while the example shown in FIG. 10 includes 4 cores in each domain, understand that more or fewer cores may be present in a given domain in other examples.

With further reference to FIG. 10, a graphics domain 1030 also is provided, which may include one or more graphics processing units (GPUs) configured to independently execute graphics workloads, e.g., provided by one or more cores of core domains 1010 and 1020. As an example, GPU domain 1030 may be used to provide display support for a variety of screen sizes, in addition to providing graphics and display rendering operations.

As seen, the various domains couple to a coherent interconnect 1040, which in an embodiment may be a cache coherent interconnect fabric that in turn couples to an integrated memory controller 1050. Coherent interconnect 1040 may include a shared cache memory, such as an L3 cache, in some examples. In an embodiment, memory controller 1050 may be a direct memory controller to provide for multiple channels of communication with an off-chip memory, such as multiple channels of a DRAM (not shown for ease of illustration in FIG. 10).

In different examples, the number of the core domains may vary. For example, for a low power SoC suitable for incorporation into a mobile computing device, a limited number of core domains such as shown in FIG. 10 may be present. Still further, in such low power SoCs, core domain 1020 including higher power cores may have fewer numbers of such cores. For example, in one implementation two cores 1022 may be provided to enable operation at reduced power consumption levels. In addition, the different core domains may also be coupled to an interrupt controller to enable dynamic swapping of workloads between the different domains.

In yet other embodiments, a greater number of core domains, as well as additional optional IP logic may be present, in that an SoC can be scaled to higher performance (and power) levels for incorporation into other computing devices, such as desktops, servers, high performance computing systems, base stations forth. As one such example, 4 core domains each having a given number of out-of-order cores may be provided. Still further, in addition to optional GPU support (which as an example may take the form of a GPGPU), one or more accelerators to provide optimized hardware support for particular functions (e.g. web serving, network processing, switching or so forth) also may be provided. In addition, an input/output interface may be present to couple such accelerators to off-chip components.

Figure 11:
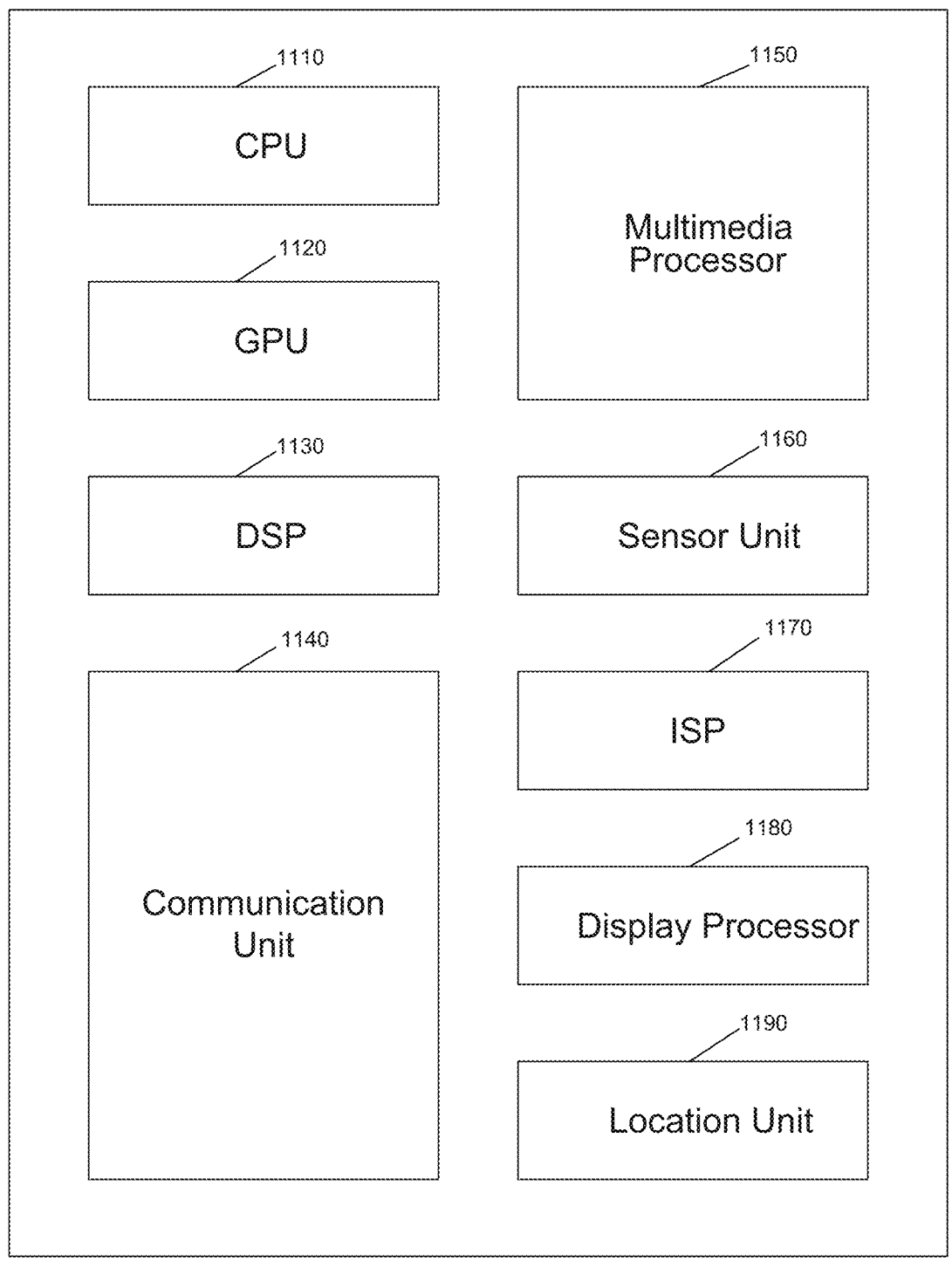
FIG. 11 is a block diagram of another example SoC in accordance with an embodiment of the present invention.

Referring now to FIG. 11, shown is a block diagram of another example SoC. In the embodiment of FIG. 11, SoC 1100 may include various circuitry to enable high performance for multimedia applications, communications and other functions. As such, SoC 1100 is suitable for incorporation into a wide variety of portable and other devices, such as smartphones, tablet computers, smart TVs, vehicle computing systems, and so forth. In the example shown, SoC 1100 includes a central processor unit (CPU) domain 1110. In an embodiment, a plurality of individual processor cores may be present in CPU domain 1110. As one example, CPU domain 1110 may be a quad core processor having 4 multithreaded cores. Such processors may be homogeneous or heterogeneous processors, e.g., a mix of low power and high power processor cores.

In turn, a GPU domain 1120 is provided to perform advanced graphics processing in one or more GPUs to handle graphics and compute APIs. A DSP unit 1130 may provide one or more low power DSPs for handling low-power multimedia applications such as music playback, audio/video and so forth, in addition to advanced calculations that may occur during execution of multimedia instructions. In turn, a communication unit 1140 may include various components to provide connectivity via various wireless protocols, such as cellular communications (including 3G/4G LTE), wireless local area protocols such as Bluetooth™ IEEE 802.11, and so forth.

Still further, a multimedia processor 1150 may be used to perform capture and playback of high definition video and audio content, including processing of user gestures. A sensor unit 1160 may include a plurality of sensors and/or a sensor controller to interface to various off-chip sensors present in a given platform. An image signal processor 1170 may be provided with one or more separate ISPs to perform image processing with regard to captured content from one or more cameras of a platform, including still and video cameras.

A display processor 1180 may provide support for connection to a high definition display of a given pixel density, including the ability to wirelessly communicate content for playback on such display. Still further, a location unit 1190 may include a GPS receiver with support for multiple GPS constellations to provide applications highly accurate positioning information obtained using as such GPS receiver. Understand that while shown with this particular set of components in the example of FIG. 11, many variations and alternatives are possible.

Figure 12:
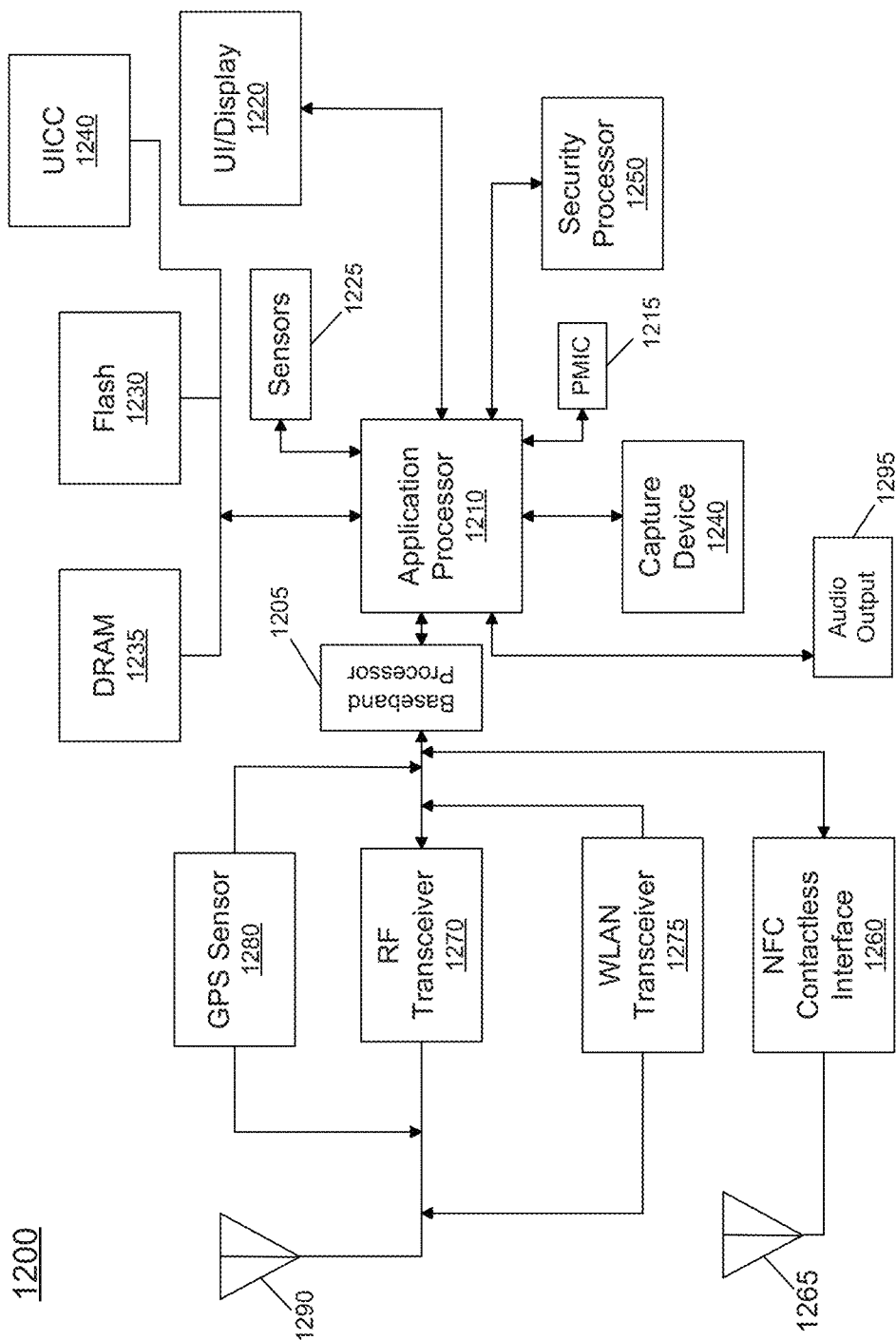
FIG. 12 is a block diagram of an example system with which embodiments can be used.

Referring now to FIG. 12, shown is a block diagram of an example system with which embodiments can be used. As seen, system 1200 may be a smartphone or other wireless communicator. A baseband processor 1205 is configured to perform various signal processing with regard to communication signals to be transmitted from or received by the system. In turn, baseband processor 1205 is coupled to an application processor 1210, which may be a main CPU of the system to execute an OS and other system software, in addition to user applications such as many well-known social media and multimedia apps. Application processor 1210 may further be configured to perform a variety of other computing operations for the device.

In turn, application processor 1210 can couple to a user interface/display 1220, e.g., a touch screen display. In addition, application processor 1210 may couple to a memory system including a non-volatile memory, namely a flash memory 1230 and a system memory, namely a dynamic random access memory (DRAM) 1235. As further seen, application processor 1210 further couples to a capture device 1240 such as one or more image capture devices that can record video and/or still images.

Still referring to FIG. 12, a universal integrated circuit card (UICC) 1240 comprising a subscriber identity module and possibly a secure storage and cryptoprocessor is also coupled to application processor 1210. System 1200 may further include a security processor 1250 that may couple to application processor 1210. A plurality of sensors 1225 may couple to application processor 1210 to enable input of a variety of sensed information such as accelerometer and other environmental information. An audio output device 1295 may provide an interface to output sound, e.g., in the form of voice communications, played or streaming audio data and so forth.

As further illustrated, a near field communication (NFC) contactless interface 1260 is provided that communicates in a NFC near field via an NFC antenna 1265. While separate antennae are shown in FIG. 12, understand that in some implementations one antenna or a different set of antennae may be provided to enable various wireless functionality.

A power management integrated circuit (PMIC) 1215 couples to application processor 1210 to perform platform level power management. To this end, PMIC 1215 may issue power management requests to application processor 1210 to enter certain low power states as desired. Furthermore, based on platform constraints, PMIC 1215 may also control the power level of other components of system 1200.

To enable communications to be transmitted and received, various circuitry may be coupled between baseband processor 1205 and an antenna 1290. Specifically, a radio frequency (RF) transceiver 1270 and a wireless local area network (WLAN) transceiver 1275 may be present. In general, RF transceiver 1270 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 1280 may be present. Other wireless communications such as receipt or transmission of radio signals, e.g., AM/FM and other signals may also be provided. In addition, via WLAN transceiver 1275, local wireless communications can also be realized.

Figure 13:
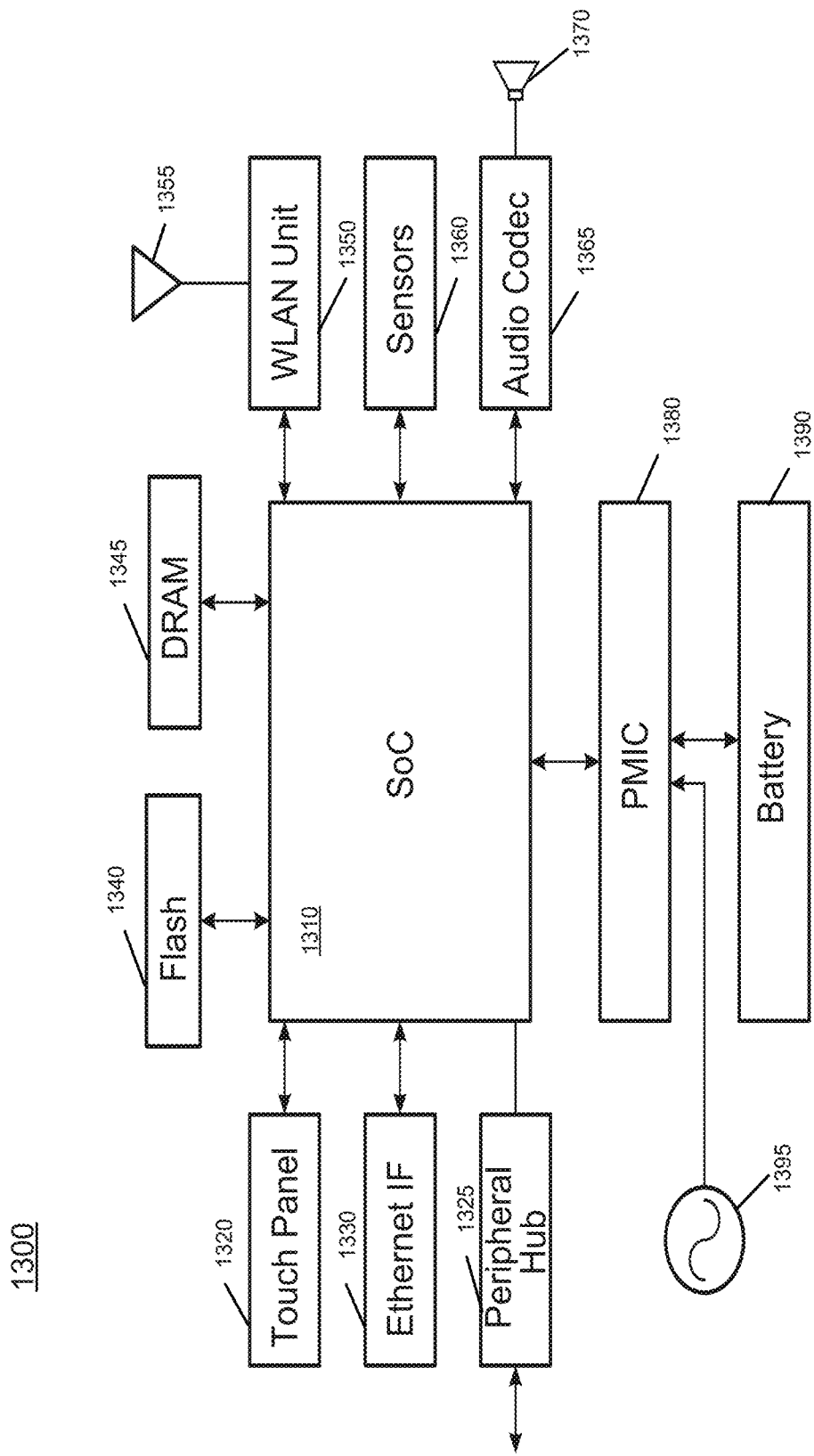
FIG. 13 is a block diagram of another example system with which embodiments may be used.

Referring now to FIG. 13, shown is a block diagram of another example system with which embodiments may be used. In the illustration of FIG. 13, system 1300 may be mobile low-power system such as a tablet computer, 2:1 tablet, phablet or other convertible or standalone tablet system. As illustrated, a SoC 1310 is present and may be configured to operate as an application processor for the device.

A variety of devices may couple to SoC 1310. In the illustration shown, a memory subsystem includes a flash memory 1340 and a DRAM 1345 coupled to SoC 1310. In addition, a touch panel 1320 is coupled to the SoC 1310 to provide display capability and user input via touch, including provision of a virtual keyboard on a display of touch panel 1320. To provide wired network connectivity, SoC 1310 couples to an Ethernet interface 1330. A peripheral hub 1325 is coupled to SoC 1310 to enable interfacing with various peripheral devices, such as may be coupled to system 1300 by any of various ports or other connectors.

In addition to internal power management circuitry and functionality within SoC 1310, a PMIC 1380 is coupled to SoC 1310 to provide platform-based power management, e.g., based on whether the system is powered by a battery 1390 or AC power via an AC adapter 1395. In addition to this power source-based power management, PMIC 1380 may further perform platform power management activities based on environmental and usage conditions. Still further, PMIC 1380 may communicate control and status information to SoC 1310 to cause various power management actions within SoC 1310.

Still referring to FIG. 13, to provide for wireless capabilities, a WLAN unit 1350 is coupled to SoC 1310 and in turn to an antenna 1355. In various implementations, WLAN unit 1350 may provide for communication according to one or more wireless protocols.

As further illustrated, a plurality of sensors 1360 may couple to SoC 1310. These sensors may include various accelerometer, environmental and other sensors, including user gesture sensors. Finally, an audio codec 1365 is coupled to SoC 1310 to provide an interface to an audio output device 1370. Of course understand that while shown with this particular implementation in FIG. 13, many variations and alternatives are possible.

Figure 14:
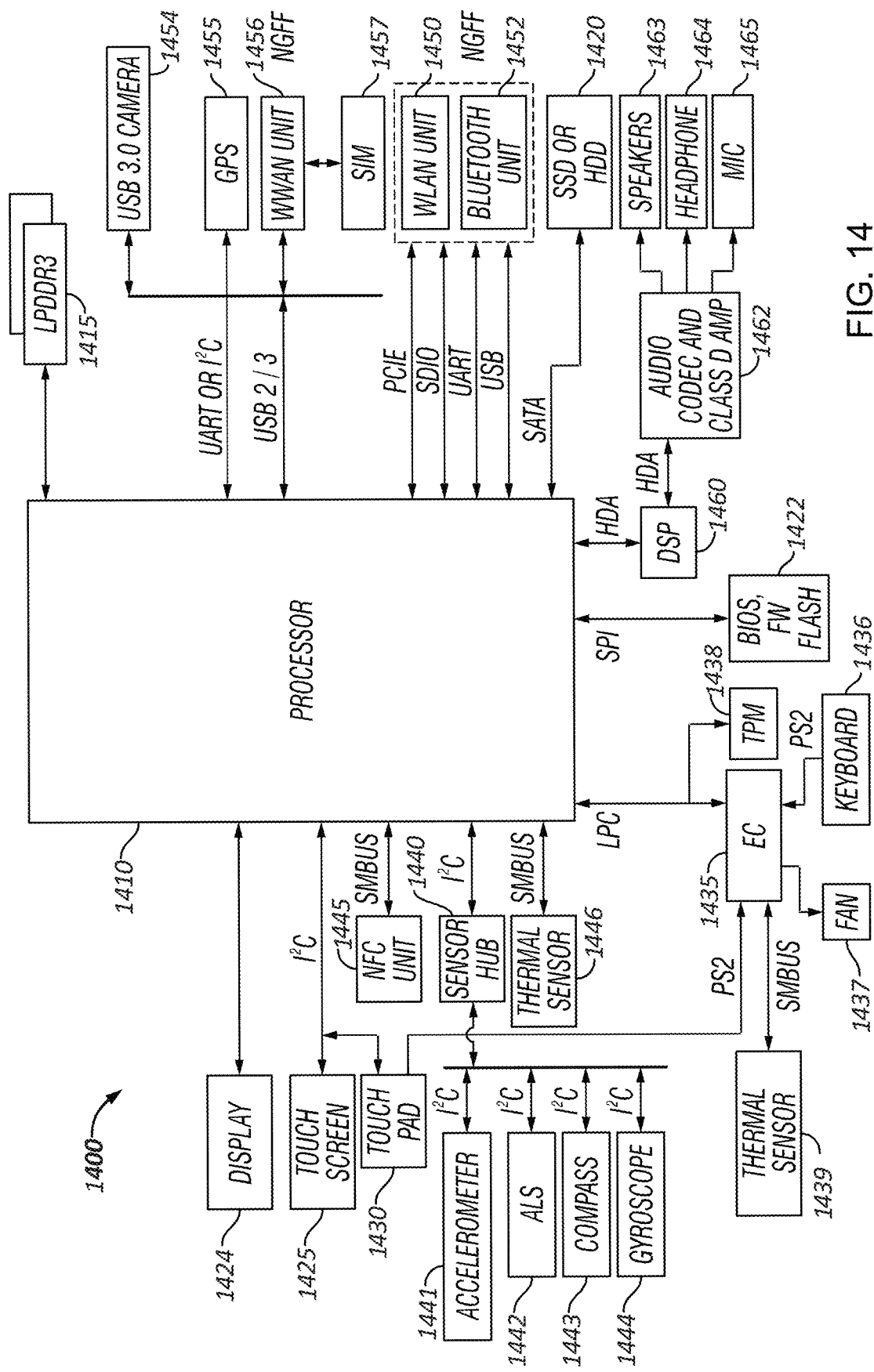
FIG. 14 is a block diagram of a representative computer system.

Referring now to FIG. 14, shown is a block diagram of a representative computer system such as notebook, Ultrabook™ or other small form factor system. A processor 1410, in one embodiment, includes a microprocessor, multi-core processor, multithreaded processor, an ultra low voltage processor, an embedded processor, or other known processing element. In the illustrated implementation, processor 1410 acts as a main processing unit and central hub for communication with many of the various components of the system 1400. As one example, processor 1400 is implemented as a SoC.

Processor 1410, in one embodiment, communicates with a system memory 1415. As an illustrative example, the system memory 1415 is implemented via multiple memory devices or modules to provide for a given amount of system memory.

To provide for persistent storage of information such as data, applications, one or more operating systems and so forth, a mass storage 1420 may also couple to processor 1410. In various embodiments, to enable a thinner and lighter system design as well as to improve system responsiveness, this mass storage may be implemented via a SSD or the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also shown in FIG. 14, a flash device 1422 may be coupled to processor 1410, e.g., via a serial peripheral interface (SPI). This flash device may provide for non-volatile storage of system software, including a basic input/output software (BIOS) as well as other firmware of the system.

Various input/output (I/O) devices may be present within system 1400. Specifically shown in the embodiment of FIG. 14 is a display 1424 which may be a high definition LCD or LED panel that further provides for a touch screen 1425. In one embodiment, display 1424 may be coupled to processor 1410 via a display interconnect that can be implemented as a high performance graphics interconnect. Touch screen 1425 may be coupled to processor 1410 via another interconnect, which in an embodiment can be an I$^2$C interconnect. As further shown in FIG. 14, in addition to touch screen 1425, user input by way of touch can also occur via a touch pad 1430 which may be configured within the chassis and may also be coupled to the same I$^2$C interconnect as touch screen 1425.

For perceptual computing and other purposes, various sensors may be present within the system and may be coupled to processor 1410 in different manners. Certain inertial and environmental sensors may couple to processor

1410 through a sensor hub 1440, e.g., via an I²C interconnect. In the embodiment shown in FIG. 14, these sensors may include an accelerometer 1441, an ambient light sensor (ALS) 1442, a compass 1443 and a gyroscope 1444. Other environmental sensors may include one or more thermal sensors 1446 which in some embodiments couple to processor 1410 via a system management bus (SMBus) bus.

Also seen in FIG. 14, various peripheral devices may couple to processor 1410 via a low pin count (LPC) interconnect. In the embodiment shown, various components can be coupled through an embedded controller 1435. Such components can include a keyboard 1436 (e.g., coupled via a PS2 interface), a fan 1437, and a thermal sensor 1439. In some embodiments, touch pad 1430 may also couple to EC 1435 via a PS2 interface. In addition, a security processor such as a trusted platform module (TPM) 1438 may also couple to processor 1410 via this LPC interconnect.

System 1400 can communicate with external devices in a variety of manners, including wirelessly. In the embodiment shown in FIG. 14, various wireless modules, each of which can correspond to a radio configured for a particular wireless communication protocol, are present. One manner for wireless communication in a short range such as a near field may be via a NFC unit 1445 which may communicate, in one embodiment with processor 1410 via an SMBus. Note that via this NFC unit 1445, devices in close proximity to each other can communicate.

As further seen in FIG. 14, additional wireless units can include other short range wireless engines including a WLAN unit 1450 and a Bluetooth unit 1452. Using WLAN unit 1450, Wi-Fi™ communications can be realized, while via Bluetooth unit 1452, short range Bluetooth™ communications can occur. These units may communicate with processor 1410 via a given link.

In addition, wireless wide area communications, e.g., according to a cellular or other wireless wide area protocol, can occur via a WWAN unit 1456 which in turn may couple to a subscriber identity module (SIM) 1457. In addition, to enable receipt and use of location information, a GPS module 1455 may also be present. Note that in the embodiment shown in FIG. 14, WWAN unit 1456 and an integrated capture device such as a camera module 1454 may communicate via a given link.

An integrated camera module 1454 can be incorporated in the lid. To provide for audio inputs and outputs, an audio processor can be implemented via a digital signal processor (DSP) 1460, which may couple to processor 1410 via a high definition audio (HDA) link. Similarly, DSP 1460 may communicate with an integrated coder/decoder (CODEC) and amplifier 1462 that in turn may couple to output speakers 1463 which may be implemented within the chassis. Similarly, amplifier and CODEC 1462 can be coupled to receive audio inputs from a microphone 1465 which in an embodiment can be implemented via dual array microphones (such as a digital microphone array) to provide for high quality audio inputs to enable voice-activated control of various operations within the system. Note also that audio outputs can be provided from amplifier/CODEC 1462 to a headphone jack 1464. Although shown with these particular components in the embodiment of FIG. 14, understand the scope of the present invention is not limited in this regard.

Figure 15:
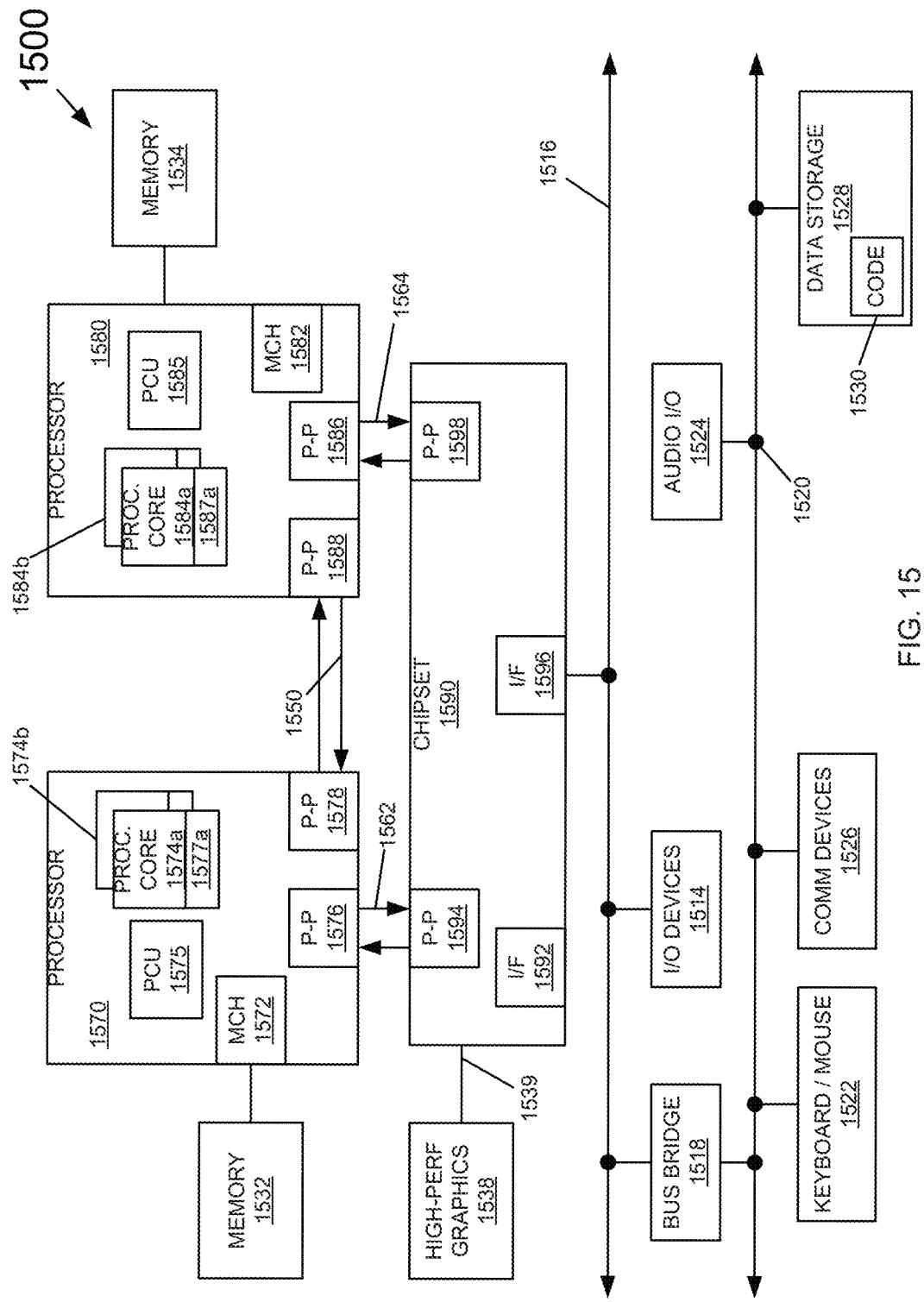
FIG. 15 is a block diagram of a system in accordance with an embodiment of the present invention.

Embodiments may be implemented in many different system types. Referring now to FIG. 15, shown is a block diagram of a system in accordance with an embodiment of the present invention. As shown in FIG. 15, multiprocessor system 1500 is a point-to-point interconnect system, and includes a first processor 1570 and a second processor 1580 coupled via a point-to-point interconnect 1550. As shown in FIG. 15, each of processors 1570 and 1580 may be multicore processors, including first and second processor cores (i.e., processor cores 1574a and 1574b and processor cores 1584a and 1584b), although potentially many more cores may be present in the processors. Such processor cores may couple to corresponding core perimeter logics 1577a and 1577b and core perimeter logics 1587a and 1587b to enable efficient communication of context and other information, both for purposes of operation during the diagnostic sleep state described herein as well as for communication of information during normal operation. Each of the processors can include a PCU 1575, 1585 or other power management logic to perform processor-based power management as described herein. To this end, PCU 1575 and 1585 may include self-test control circuitry to periodically cause a given core (or group of cores) to enter into a diagnostic sleep state to perform in-field self-testing to identify failing components.

Still referring to FIG. 15, first processor 1570 further includes a memory controller hub (MCH) 1572 and point-to-point (P-P) interfaces 1576 and 1578. Similarly, second processor 1580 includes a MCH 1582 and P-P interfaces 1586 and 1588. As shown in FIG. 15, MCH's 1572 and 1582 couple the processors to respective memories, namely a memory 1532 and a memory 1534, which may be portions of system memory (e.g., DRAM) locally attached to the respective processors. First processor 1570 and second processor 1580 may be coupled to a chipset 1590 via P-P interconnects 1562 and 1564, respectively. As shown in FIG. 15, chipset 1590 includes P-P interfaces 1594 and 1598.

Furthermore, chipset 1590 includes an interface 1592 to couple chipset 1590 with a high performance graphics engine 1538, by a P-P interconnect 1539. In turn, chipset 1590 may be coupled to a first bus 1516 via an interface 1596. As shown in FIG. 15, various input/output (I/O) devices 1514 may be coupled to first bus 1516, along with a bus bridge 1518 which couples first bus 1516 to a second bus 1520. Various devices may be coupled to second bus 1520 including, for example, a keyboard/mouse 1522, communication devices 1526 and a data storage unit 1528 such as a disk drive or other mass storage device which may include code 1530, in one embodiment. Further, an audio I/O 1524 may be coupled to second bus 1520. Embodiments can be incorporated into other types of systems including mobile devices such as a smart cellular telephone, tablet computer, netbook, Ultrabook™, or so forth.

Figure 16:
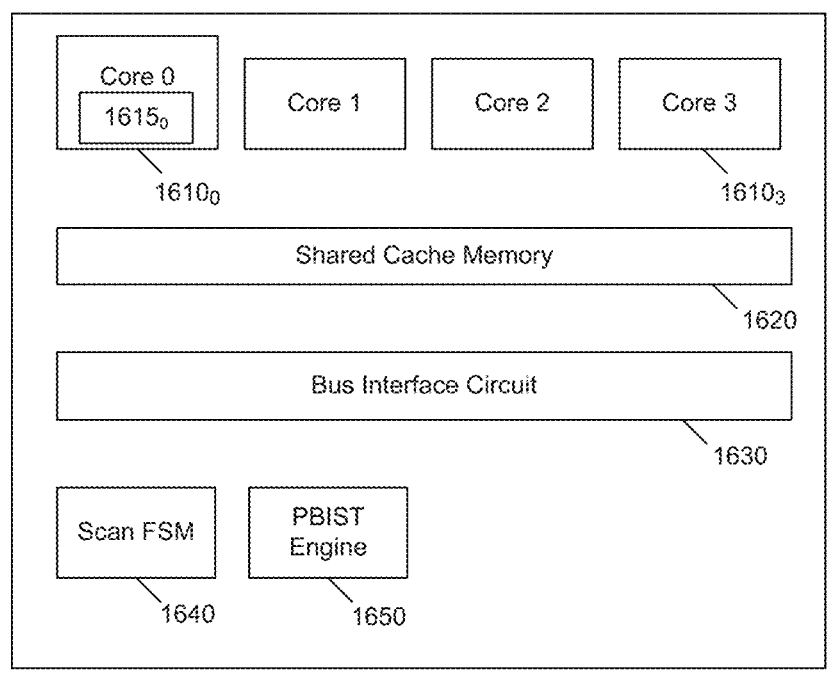
FIG. 16 is a block diagram of a portion of a processor in accordance with an embodiment of the present invention.

Referring now to FIG. 16, shown is a block diagram of a portion of a processor in accordance with an embodiment of the present invention. As shown in FIG. 16, a module 1600 may be one of many processing modules present in a given multicore processor or other SoC. As seen, module 1600 includes a plurality of cores $1610_0$-$1610_3$. While four cores are shown for ease of illustration in FIG. 16, understand that in other embodiments a module or cluster may include more or fewer cores. Module 1600 further includes a shared cache memory 1620 accessible by test circuitry. In embodiments herein, during an in-field self test of module 1600, state stored within shared cache memory 1620 may be flushed to a further portion of a memory hierarchy, and test information in the form of one or more test patterns and operating parameter information may be stored within shared cache memory 1620.

Still with reference to FIG. 16, module 1600 also includes a bus interface circuit 1630. In general, bus interface circuit 1630 includes various shared circuitry that may be accessed by cores 1610. As described further herein, such shared circuitry may include interface circuitry to interface module

1600 to other portions of a processor, a local power controller (such as in the form of a power management agent (PMA)), and other circuitry. Still with reference to module 1600, a scan FSM 1640 is present, along with a PBIST engine 1650, which may be used to perform self-testing of memory arrays within cluster 1600 and in bus interface circuit 1630. In general, scan FSM 1640 may be an implementation of a test controller that is configured to perform scan-based testing of logic circuitry within cores 1610 and bus interface circuit 1630, in response to a trigger of an in-field self test, such as by way of a write to a built in self-test machine specific register (MSR) of one or more cores 1610. Understand while shown at this high level in the embodiment of FIG. 16, many variations and alternatives are possible.

In one embodiment, an in-field scan built-in self test (BIST) can be initiated by BIOS or other firmware by using the MSR. In one embodiment, a scan BIST MSR receives and stores a pointer to a test pattern module. In an embodiment, this MSR may include, in addition to an address field to store an address of a location of a test pattern, a type field to indicate a type of self test to be performed (such as a scan self test and/or a memory self test). Still further, an error signaling field may indicate whether a failure causes a machine check error to be asserted. When this MSR is written on a first core (e.g., core $1610_0$) of the module 1600, microcode (e.g., stored in a microcode ROM $1615_0$) saves the state of that core to a low power memory (e.g., within bus interface circuit 1630), and enters the diagnostic sleep state, which is an unbreakable sleep state. Thereafter, the BIOS invokes a write to this MSR on each core in module 1600. Note while a single core is shown including microcode storage, understand that in embodiments each core may include or otherwise be associated with a microcode store.

The last core (e.g., core $1610_3$) in module 1600 saves that core's state to the low power memory and the shared state of module 1600 (e.g., of bus interface circuit 1630) to the low power memory. Following this state save, core $1610_3$ (e.g.) flushes shared cache memory 1620 and copies the scan pattern module into cache 1620. Microcode then verifies the signature on the scan pattern module and if the signature verifies, checks the hash of the scan pattern module to the signed hash. If the hash check succeeds, then the microcode decrypts this module in cache 1620. Once the scan pattern module contents have been decrypted in cache 1620, microcode then programs scan FSM 1640 with various operating parameters. Although the scope of the present invention is not limited in this regard, in an embodiment the operating parameters include number of pattern packets in the module, start address, expected golden multiple input signature register (MISR) signature following scan BIST, etc. These parameters may be themselves part of the scan pattern module. Note that while FIG. 16 shows an implementation with multiple cores, understand that in other embodiments the self-testing described herein may be performed in a processor or other SoC having only a single core.

Embodiments may be used in a wide variety of semiconductor devices including processors and other SoCs for various applications. In some cases, embodiments may be incorporated in products for industrial and automotive markets (e.g., autonomous driving cars) where there can be various requirements for functional safety. This is so, as some products may have more demanding reliability targets (e.g., a failure while performing autonomous driving may have a harsh outcome), such that a core cannot be compromised while performing mission critical tasks. In embodiments, the in-field self testing can be performed on a core when it is isolated from normal operation, such as responsive to entry of the core into a given low power state, such as the diagnostic sleep state described herein.

Figure 17:
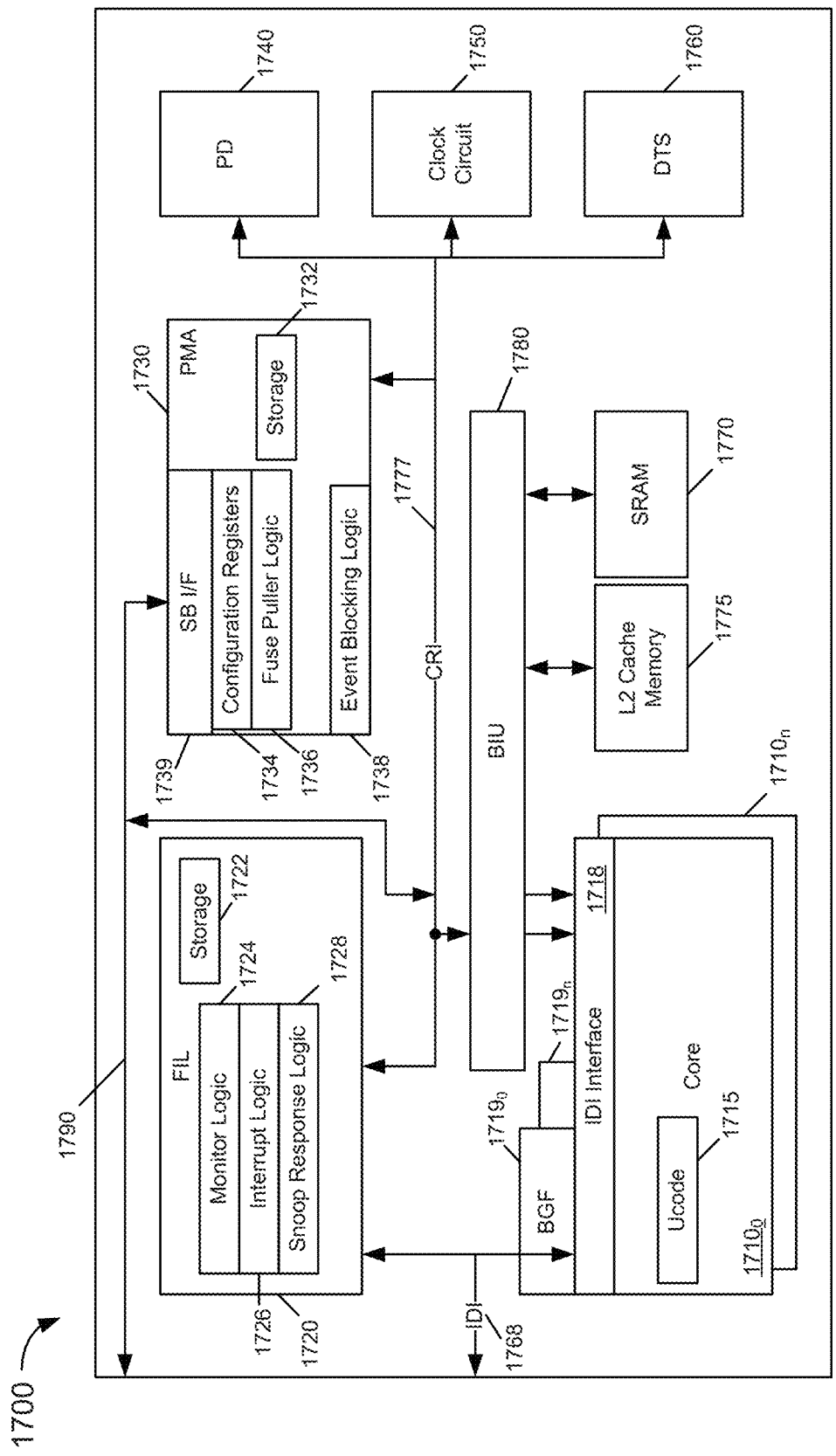
FIG. 17 is a block diagram of a processor in accordance with an embodiment of the present invention.

Referring now to FIG. 17, shown is a block diagram of a processor in accordance with an embodiment of the present invention. More specifically, the portion of processor 1700 shown in FIG. 17 is of a given cluster or module, where the processor itself may include a plurality of such clusters. As shown in FIG. 17, processor 1700 includes a plurality of cores $1710_0$-$1710_n$ and a bus interface unit 1780 that acts as shared circuitry interface between cores 1710 and additional circuitry within processor 1700. Understand that in multi-core embodiments, each core may have its own core perimeter logic. With the isolation mode self-testing described herein, when a cluster is in the isolation mode of a diagnostic sleep state and actively executing self testing (in a C0 state), it appears to other portions of the core perimeter logic as being in a low power state (e.g., a C6 state).

In the particular embodiment shown in FIG. 17, core 1710, a power management agent (PMA) 1730 and additional power delivery and clocking circuitry (further discussed below) may be in an active state (e.g., a C0 state) during this isolation mode-based self testing. However, such circuitry appears to additional core perimeter logic, namely a fabric interface logic (FIL) 1720, as though it were in a low power (e.g., C6) state.

In the high level shown in FIG. 17, the components of processor 1700 all may be implemented on a single semiconductor die. As seen, core 1710 includes a microcode storage 1715, which may store various microcode to execute on core 1710, including cryptography microcode to perform authentication and decryption of test patterns as described herein. As further illustrated, processor 1700 includes additional storages, including a low power memory 1770, which in an embodiment may be a static random access memory (SRAM, a so-called "C6 SRAM") in which various context or state information of a cluster is stored while in a diagnostic sleep state. Note that the terms "state information" and "context information" are used interchangeably herein, and refer to information such as control register values, data information, register-stored information, and other information associated with a thread being executed on a core or other logic. Such information can be saved when the corresponding thread is switched from the core, e.g., due to entry into a low power state or migration to another core.

In an embodiment, memory 1770 may be configured to remain powered on while the core is in certain low power states. As an example, memory 1770 may maintain information while a core is in a given low power state (e.g., C6) and the processor package is in a package active state (C0). However, in other low power states, such power may not be available, and the context information may be sent to other storages. As further illustrated, a shared cache memory 1775 also couples to bus interface unit 1780. As illustrated, cache memory 1775 may be implemented as an L2 cache memory that acts as a shared cache memory for the various cores of the cluster. In addition during in-field self testing as described herein, a state stored in this cache memory may be flushed and one or more test patterns, operating parameter information and so forth regarding the self testing may be obtained and stored in cache memory 1775.

Core 1710 further includes an intra-die interconnect (IDI) interface 1718 to interface with an IDI 1768. Although not shown for ease of illustration, understand that IDI 1768 may couple cores 1710 with various other circuitry within the processor (not shown for ease of illustration in FIG. 17), including one or more other clusters, a peripheral controller hub (PCH), one or more cache memories and/or other uncore circuitry. To provide for an interface between core 1710 and other components within the processor that may operate at different frequencies, a clock crossing logic 1719 may be provided, which in an embodiment may be implemented as a bubble generator first in first out (FIFO) buffer.

To enable core 1710 to enter into particular and deeper low power states when available, a first core perimeter logic, namely FIL 1720, is coupled to core 1710. FIL 1720 may be of a first sustain power domain, in that it is provided with power and clock signals when at least portions of the processor are in a low power state. As seen, FIL 1720 couples to cores 1710 via both IDI 1768 and a second interconnect 1777, which in an embodiment is a control register interconnect (CRi). Interconnect 1777 may be a relatively simple and low performance interconnect to provide for communication of state information during save and restore operations for low power state entry and exit.

In the embodiment shown in FIG. 17, FIL 1720 includes a storage 1722, which may be implemented as a plurality of registers configured to store the state information received from cores 1710 prior to their entry into a given low power state. In certain low power states, power may be maintained to FIL 1720 until the processor package enters a deeper package low power state (e.g., a package C6 state) when a coherent fabric enters a low power state. As further shown, FIL 1720 includes a monitor logic 1724, an interrupt control logic 1726, and a snoop response logic 1728. In general, monitor logic 1724 may be configured, when core 1710 is in a low power state, to monitor one or more monitored locations for an update to a value stored therein. In turn, interrupt control logic 1726 may be configured to handle incoming interrupts while core 1710 is in a low power state. Such handling may include delaying the interrupt and/or sending a response to the interrupt. Still further, in some cases the handling may include causing core 1710 to wake up to handle the interrupt. Also, FIL 1720 includes a snoop response logic 1728, which may be configured to send a snoop response to a snoop request that is incoming while core 1710 is in a low power state.

Still referring to FIG. 17, an additional core perimeter logic is a power management agent (PMA) 1730. In general, PMA 1730 may be configured to provide an interface to other processor and system components via a sideband interconnect 1790, which may be a power management sideband interconnect. PMA 1730 may be of a second sustain power domain, in that it is provided with power and clock signals when other portions of processor 1700 (including FIL 1720) are in a low power state. PMA 1730 includes a storage 1732 that may be configured to store the state information obtained from FIL 1720. This state information may include a current or active advanced programmable interrupt controller (APIC) identifier (ID) for core 1710, to enable PMA 1730 to respond to broadcast wake/APIC ID messages. In embodiments, PMA 1730 may be configured to send the results of the self-testing of core 1710 to a power controller such as a PCU via sideband interconnect 1790.

In the embodiment shown, PMA 1730 includes a fuse puller logic 1736 that may include one or more FSMs to perform save and restore operations when PMA 1730 itself is to be placed into a low power state. For example, the information stored in storage 1722 may be flushed to system memory when the processor package enters a still deeper package low power state (e.g., a package C10 state). In some cases, PMA 1730 may interface with a main power controller of a processor such as a PCU or other power management entity. PMA 1730 further includes an event blocking logic 1738, which may be configured to block incoming events when the processor is in particular low power states, including during the isolation mode described herein. Still further, PMA 1730 also includes a sideband interface 1739, which may interface with sideband interconnect 1790.

Understand that a processor may include additional components and circuitry. In the illustration of FIG. 17, processor 1700 further includes a power delivery unit 1740, which in an embodiment may include one or more fully integrated voltage regulators, a clock circuit 1750, which in an embodiment may be implemented as a phase lock loop, and a digital thermal sensor 1760. As seen, each of these components may communicate with the other components of processor 1700 via interconnect 1777. Understand while shown with this particular processor implementation in FIG. 17, many variations and alternatives are possible.

In some cases, a PCU or other power controller may periodically force a given cluster into the isolation mode to cause it to run diagnostic tests as described herein. In other cases, the PCU can cause the testing to be performed at a system power state entry (e.g., an S3 state). When the core is in this isolation mode, core-external entities may consider the core in a low power state. For example, core perimeter logic such as FIL 1720 may ignore snoops, delay interrupts and PMA 1730 will block events. As such, when in the isolation mode, the core under test has no interaction with external components.

In embodiments a given core 1710 may obtain one or more tests from a storage and store the tests for execution within cache memory 1775. Note that the test suite stored in shared cache memory 1775 is the same for all cores of a cluster. In some embodiments, these tests may be a subset of diagnostic tests used in a manufacturing facility to perform manufacturing testing or hypothetical use testing. In some cases, a given test suite case be executed in a single iteration of the isolation mode as a single pass, or different tests or chunks can be split into multiple iterations of small chunks of micro-tests.

Figure 18:
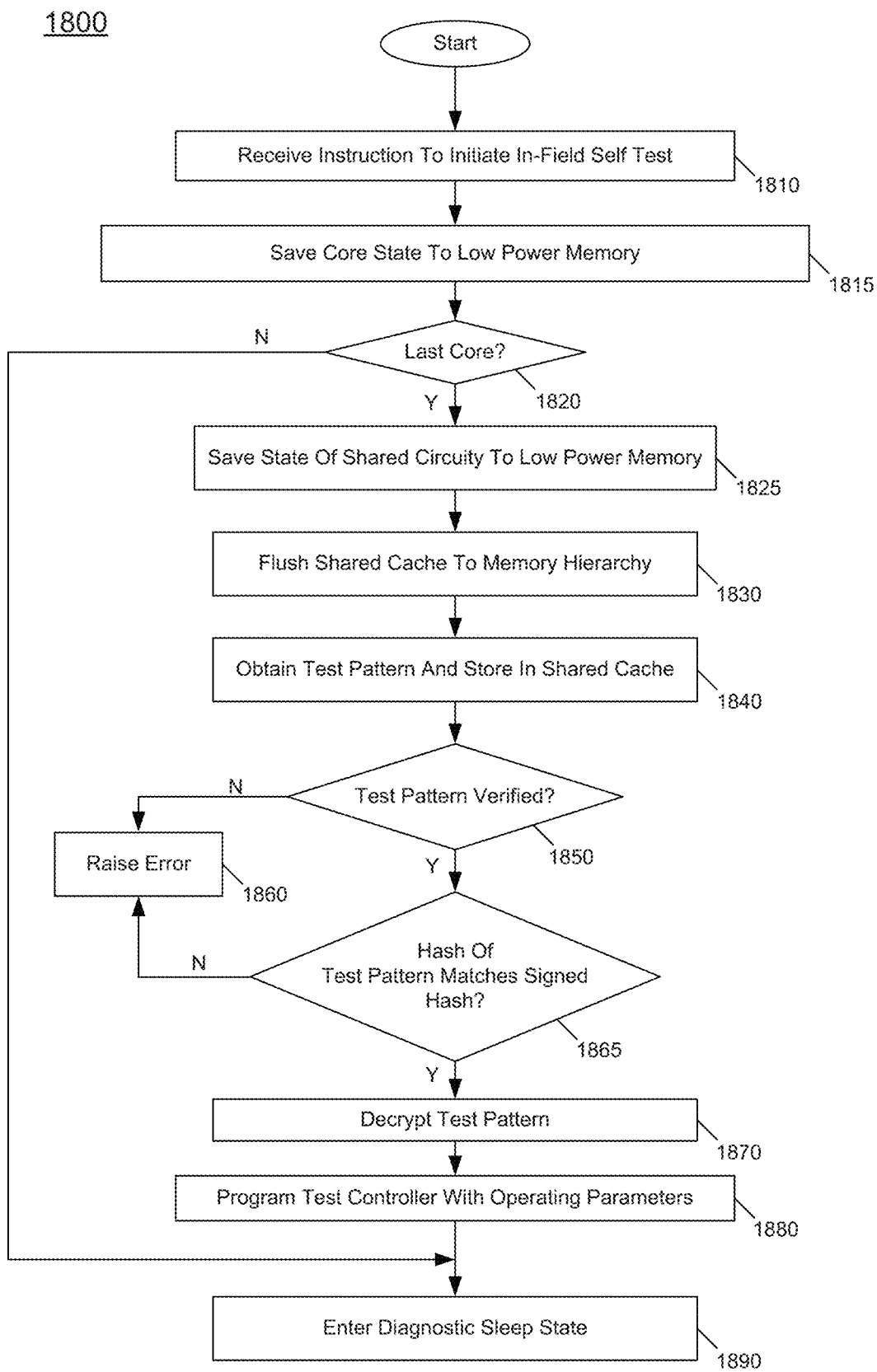
FIG. 18 is a flow diagram of a method in accordance with an embodiment of the present invention.

Referring now to FIG. 18, shown is a flow diagram of a method in accordance with an embodiment of the present invention. As shown in FIG. 18, method 1800 is a high level view of initiation operations for an in-field self test of one or more cores or other processing circuitry as described herein. More specifically, method 1800 is described from the view of a processing core that is to perform this self test. As such, embodiments may be implemented using hardware circuitry, firmware, software, and/or combinations thereof. As illustrated, method 1800 begins by receiving an instruction to initiate the in-field self test (block 1810). In one embodiment, this instruction may be implemented as a write to a self-test register. In one embodiment, this register may be implemented as a control register to be written by firmware or other system software with an address or other pointer to a location at which the self test is stored. In other cases, a user-level instruction may be used to initiate the self test.

In any event, control next passes to block 1815 where the core may save its state to a low power memory and additionally flush the core data cache. Note that as used herein the term "low power memory" is used to refer to a memory in which information is stored and maintained while a processor is in a particular low power state. As such, this memory is provided with an appropriate operating voltage and frequency during the low power state to enable its maintenance of stored information. In one embodiment, this memory may be a C6 SRAM. In another embodiment this memory may be a reserved range of DRAM that is encrypted and integrity protected. Next it is determined whether this core is the last core of a group of cores (e.g., a module or cluster) to receive this instruction (diamond 1820). As an example, reference may be made to a status register that provides fields for each core of this group which when set, indicates that the corresponding core has received this self test initiation signal and has begun or is in execution of the self test. If the core determines that it is the last core of the group to save its state away and enter into the self test mode, control passes to block 1825 where the core may also cause the state of shared circuitry (such as bus interface circuitry) to be stored to this low power memory. In many cases, this memory may be the same as the low power memory in which the core state is saved. However understand that scope of the present invention is not limited in this regard and in other cases another low power memory may be used for storage of this shared circuitry state.

Still with reference to FIG. 18, control next passes to block 1830 where a shared cache may be flushed to a memory hierarchy. In an embodiment, this shared cache may be an L2 cache that is shared by the various cores of this module. Note that in different implementations, and depending upon environment, the flush location may be a last level cache (LLC) or further portions of the memory hierarchy, such as a system memory (e.g., DRAM). Next, control passes to block 1840 where a test pattern may be obtained and stored in the shared cache memory. As discussed above, in an embodiment a pointer may be provided to identify an address from which the test pattern may be obtained. Note that in an embodiment, this test pattern may be a scan pattern that is to be executed in the core, e.g., according to a scan self test procedure.

Still with reference to FIG. 18, next it is determined whether this test pattern is verified (diamond 1850). If not, an error may be raised (block 1860). Although the scope of the present invention is not limited in this regard in one embodiment the core may raise a machine check architecture (MCA) error. If the test pattern is verified, control passes to diamond 1865 where it is next determined whether a hash of the test pattern matches a signed hash. If so, control passes to block 1870 (and otherwise, control passes to block 1860 to raise an error).

At block 1870, the test pattern may be decrypted. In an embodiment, a core may include a microcode decryption infrastructure that may be leveraged to perform this decryption, e.g., using decryption micro-operations. Thereafter, at block 1880 a test controller that is to manage the self test within the core is programmed with operating parameters. In one embodiment, this test controller may be implemented as a scan FSM within shared circuitry of the module (e.g., as part of bus interface circuitry). In an embodiment, such operating parameters may be obtained within the test pattern module itself, now decrypted and stored in the shared cache memory.

Finally, control passes to block 1890 where the core enters into a diagnostic sleep state. Note that in this diagnostic sleep state, the core appears to outside entities as being in a low power state. Nevertheless, the core does not actually enter into a low power state. Stated another way, in this diagnostic sleep state, the core still receives an operating voltage and one or more clock signals such that it is able to execute a self-test suite or an in-field self test, further details of which are discussed below. Understand while shown at this high level in the embodiment of FIG. 18, many variations and alternatives are possible.

Figure 19:
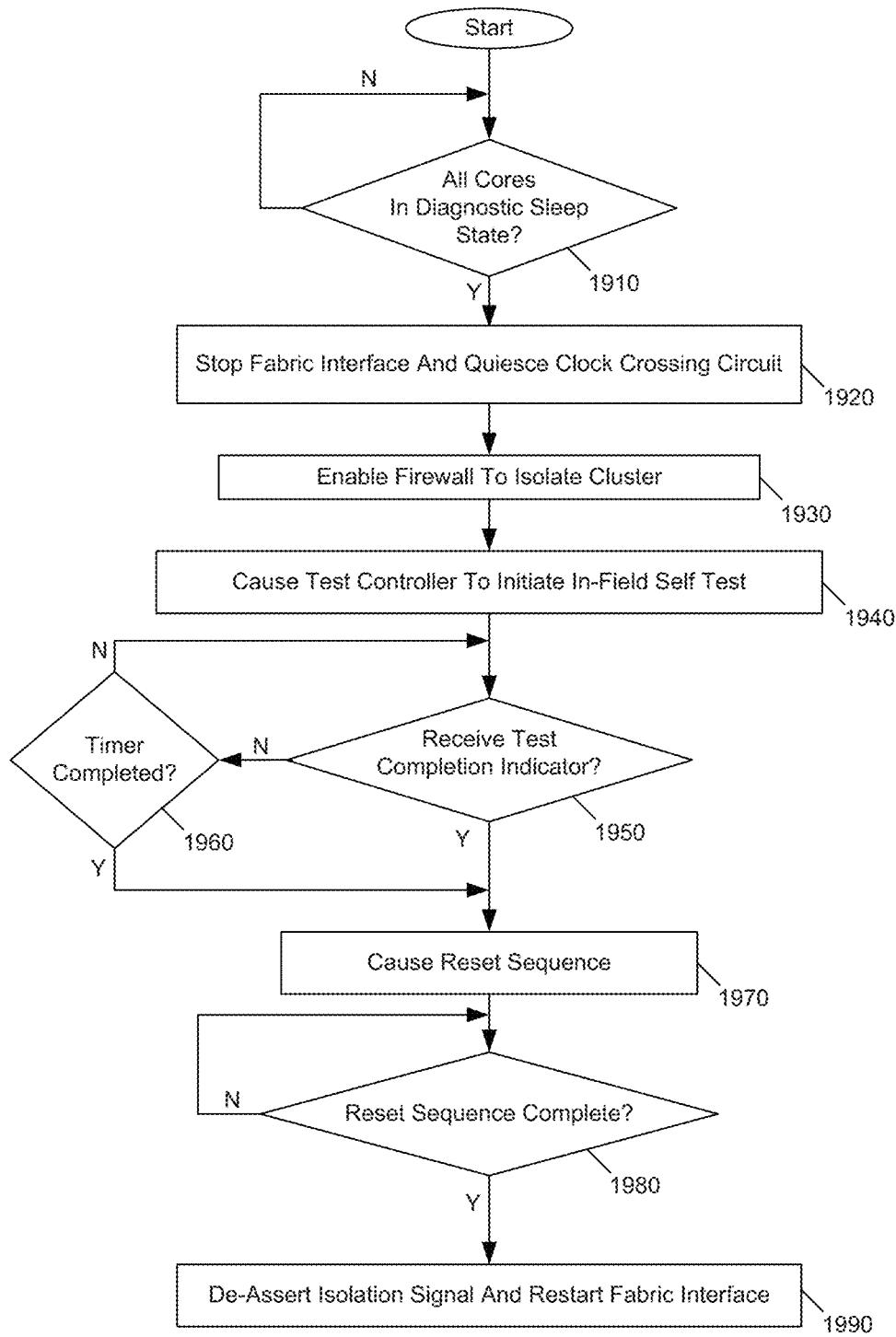
FIG. 19 is a flow diagram of a method in accordance with another embodiment of the present invention.

Referring now to FIG. 19, shown is a flow diagram of a method in accordance with another embodiment of the present invention. More specifically, method 1900 is a flow diagram of a self-test management process, e.g., performed by a power controller such as a power management agent (PMA), e.g., of a multi-core module as described herein. As such, embodiments may be implemented using hardware circuitry, firmware, software, and/or combinations thereof.

As seen, method 1900 begins by determining whether all cores (e.g., of the module) are in the diagnostic sleep state (diamond 1910). In an embodiment, the power controller may access a status register or other storage to make this determination. When it is determined that all of these cores are in the diagnostic sleep state, control passes to block 1920 where a fabric interface may be stopped and clock crossing circuitry may be quiesced. These operations are effected to isolate this module or cluster from a remainder of a processor, which may continue to operate in a normal execution mode while the self test is performed on this module. Thereafter at block 1930 a firewall is enabled to isolate this cluster. As such, the entire cluster appears to external circuitry (namely the remainder of a processor), as being in a low power state. Nevertheless, while in this diagnostic sleep state, the cluster remains powered and clocked, to enable the self test to occur. Next, control passes to block 1940 where the power controller may cause the test controller to initiate the in-field self test. In an embodiment, this test controller may be implemented as a scan FSM or an independent test controller (such as a JTAG or TAP controller). Thus at this point the given cores may perform the in-field self testing.

Next it is determined at diamond 1950 whether a test completion indicator has been received. In an embodiment, this indication thus indicates that all cores of the cluster have completed self testing. If this indicator is not received, control passes to diamond 1960 to determine whether a timer interval has completed. This timer may correspond to a dead man timer. If the dead man timer times out without completion of the self testing, this may be an indication of some error or other upset in the self testing.

In any event, control next passes to block 1970 where a reset sequence is caused to occur. This reset sequence may be performed on the individual cores to clear out any stale test content or other state of the core to enable the core to begin or continue normal execution. Note however that this reset is simply a clearing of the testing state in the core; the core does not require a reboot or other extensive re-initialization, such that continued functional operation may resume within the core with very low latency. Next it is determined whether this reset sequence has completed (diamond 1980). When this sequence is determined to have completed, control passes to block 1990 where an isolation signal may be de-asserted and the fabric interface may be restarted. As such at this point, the module is enabled to interact with additional circuitry of the processor and thus the module appears to this circuitry as being in a normal operating mode. Understand while shown at this high level in the embodiment of FIG. 19, many variations and alternatives are possible.

Figure 20:
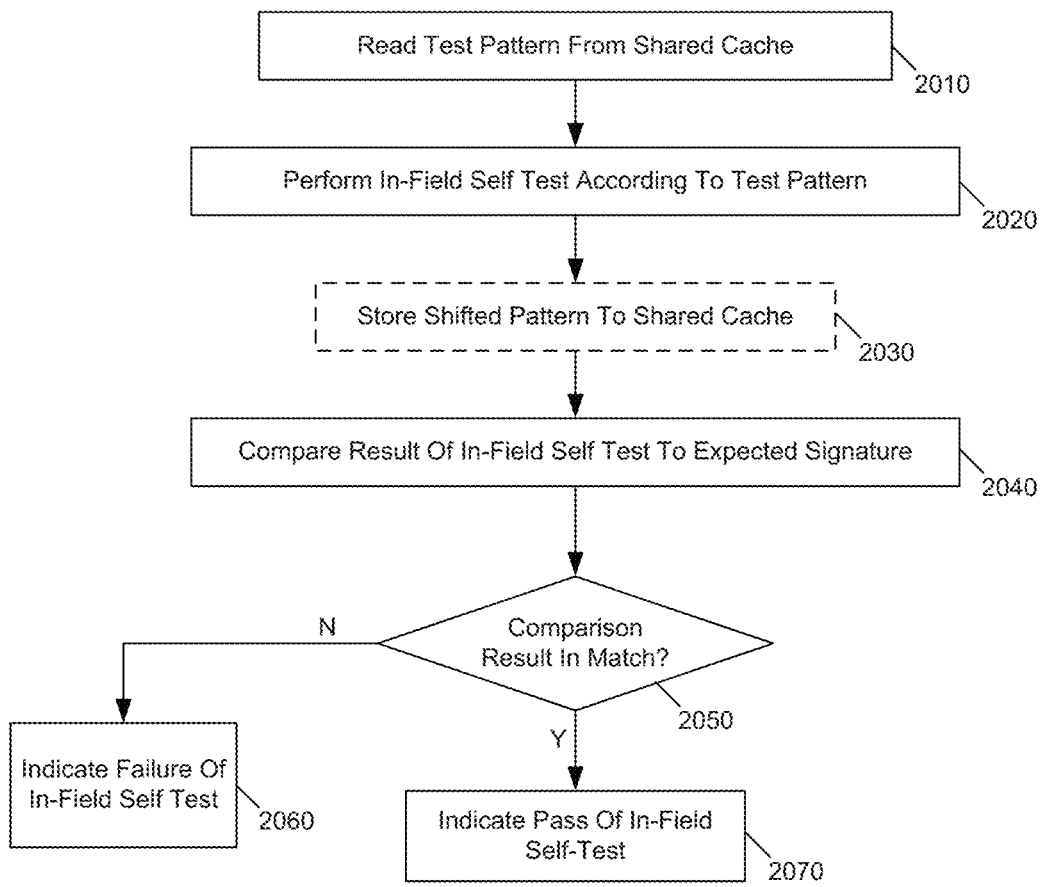
FIG. 20 is a flow diagram of a method in accordance with a still further embodiment of the present invention.

Referring now to FIG. 20, shown is a flow diagram of a method in accordance with a still further embodiment of the present invention. More specifically, method 2000 of FIG. 20 is a detailed method for performing an in-field self test of a core itself. As seen, method 2000 begins by reading a test pattern from the shared cache (block 2010). Note that at this point this test pattern (which may be a single test pattern or a collection of multiple test (e.g., scan) patterns, is in a decrypted state, such that it is directly accessible by the scan test FSM. Next at block 2020 an in-field self test may be performed according to this test pattern. In an embodiment where the test pattern is a scan pattern, this test may be a scan self test in which the scan pattern is shifted into a scan chain of the core (each scan circuit of which may be associated with a given functional circuit of the core) and shifted through the scan chain to fully test, e.g., combinational logic of the core. In one example, a scan BIST may be used to set and observe every flip-flop within a circuit under test. To this end, a test pattern may be scanned in to a series of flip-flops that in turn couple to combinational logic of the core. In this way, the test pattern scanned in may proceed through the scan chain and be scanned out to provide a test result. Such testing may further include direct access testing to access one or more memory arrays.

Still with reference to FIG. 20, at optional block 2030 the patterns shifted out of the scan chain may be stored, e.g., to the shared cache memory. In this way, with this detailed scan information, diagnostic operations, debugging and other fault detection/isolation procedures may be performed. In one embodiment, this shifted out data may be then subsequently encrypted in the field by microcode following completion of reset such that it can be sent back to the factory or other destination.

Still with reference to FIG. 20, control passes to block 2040 where the core may compare a result of the in-field self test to an expected signature. Note that in embodiments, this expected signature may be obtained from the shared cache memory that stores the test pattern itself. That is, in some cases the expected signature may be stored in association with the test pattern. In some cases the expected signature value may be read from the shared cache memory that stores the test pattern and programmed into a control register in the scan controller by microcode prior to initiating the self-test sequence. In a particular embodiment, this signature is a so-called golden signature that is the expected output from the scan chain in response to the input of the scan pattern.

Still with reference to FIG. 20, next it may be determined whether this comparison results in a match (diamond 2050). If so, the core may indicate that it has successfully passed the in-field self test (block 2070). Otherwise, at block 2060, the core may indicate that it has failed. In an embodiment, such indications may be made by providing an indicator within a self-test status storage. For example, the core may set a corresponding indicator to a first state (e.g., logic high) to indicate that it passed the self test, and instead reset this indicator to a logic low state to indicate that it failed the self test. Also in connection with this indication, the core may further indicate to, e.g., the power management agent that it has completed the self test. Understand while shown at this high level in the FIG. 20, many variations and alternatives are possible.

Figure 21:
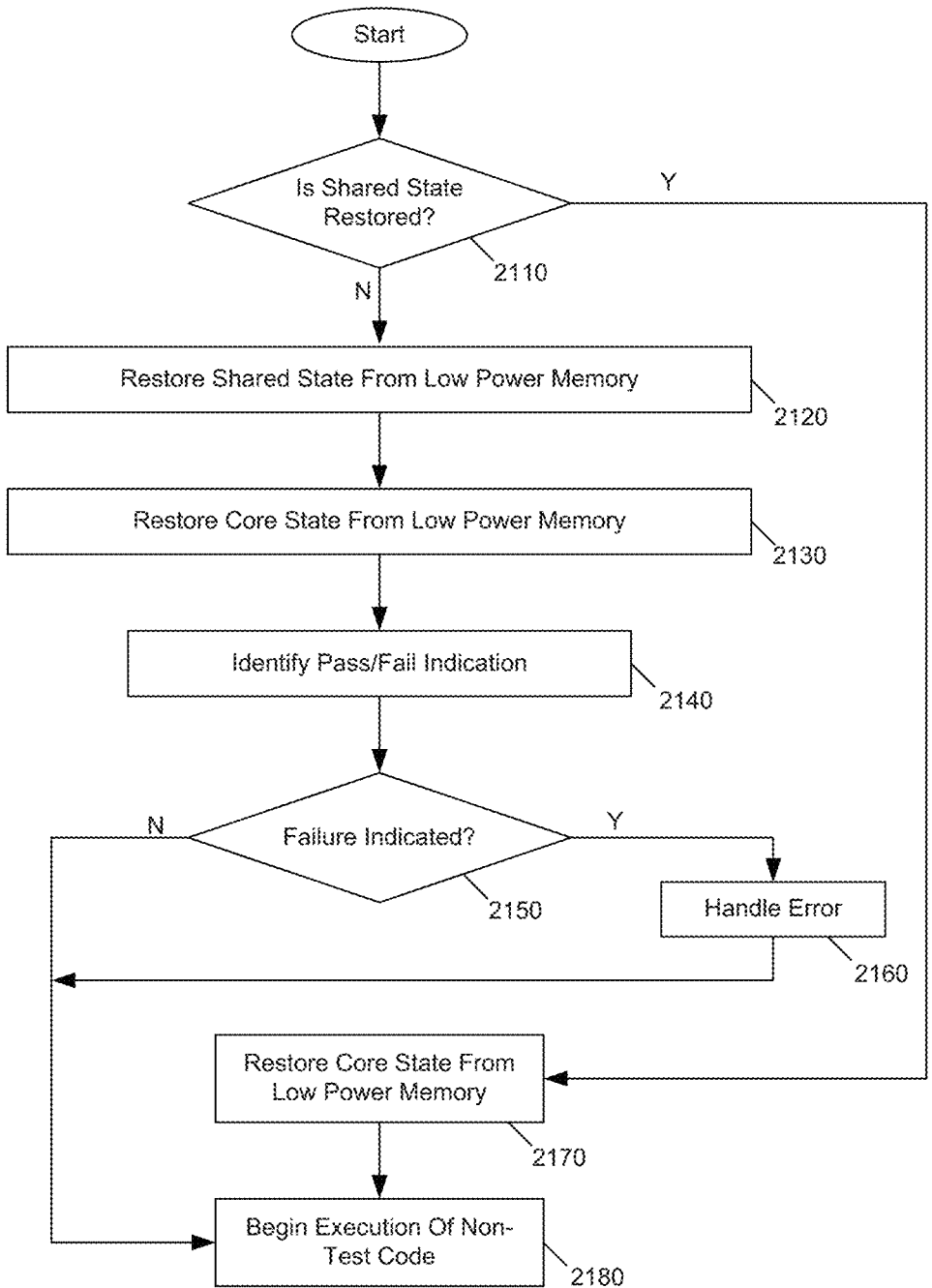
FIG. 21 is a flow diagram of yet another method in accordance with an embodiment.

Referring now to FIG. 21, shown is a flow diagram of yet another method in accordance with an embodiment. As shown in FIG. 21, method 2100 is a method for concluding in-field self testing as described herein. To this end, method 2100 may be performed by a given core of a group of cores as described herein. As seen, method 2100 begins by determining whether a shared state, e.g., of interface circuitry has been restored (diamond 2110). Assuming not, control passes to block 2120 where the core may restore this shared state from the low power memory to the shared circuitry. Next, control passes to block 2130 where the core may restore its own state from the low power memory.

Still with reference to FIG. 21, next it is determined whether the self testing performed on this cluster of cores was successful. More specifically, the core may access a status storage or other location to identify whether all cores successfully passed the in-field self testing (or not). Based on this obtained information it is determined at diamond 2150 whether a failure is indicated. If so, control passes to block 2160 where a given error handling mechanism may be performed. For example, the core may simply log the error, e.g., in an error log. In other cases, the core may report or raise the error. In some cases, this error handling mechanism may be based on the type of error and an error handling policy that dictates how to handle the error.

In any event, this core, with its own state restored, may proceed to block 2180 where it may begin or continue execution of non-test code. More specifically, in embodiments in which this in-field self testing is iteratively performed during normal operation, the core may continue whatever normal functionality it was performing prior to its entry into the in-field self testing. More specifically, the core may begin execution at a next instruction following the instruction that caused it to enter into the in-field self test.

Still with reference to FIG. 21, note that if the core instead determines at diamond 2110 that the shared state already has been restored (meaning that this core is not the first core to exit out of the diagnostic sleep state), control passes to block 2170. There the core state is restored from the low power memory and control then passes to block 2180 for beginning/continuing normal code execution. Understand while shown at this high level in the embodiment of FIG. 21, many variations and alternatives are possible.

Embodiments may use a microcode authentication and encryption framework to package in-field scan patterns. In addition, a scan FSM used for high volume manufacturing can be programmed through microcode, to execute test patterns sourced from a shared cache memory, instead of using an external test controller and storage. As examples, embodiments may be incorporated in automotive and airplane vehicle systems that implement functional safety certifications to enable autonomous driving and avionics.

Figure 22:
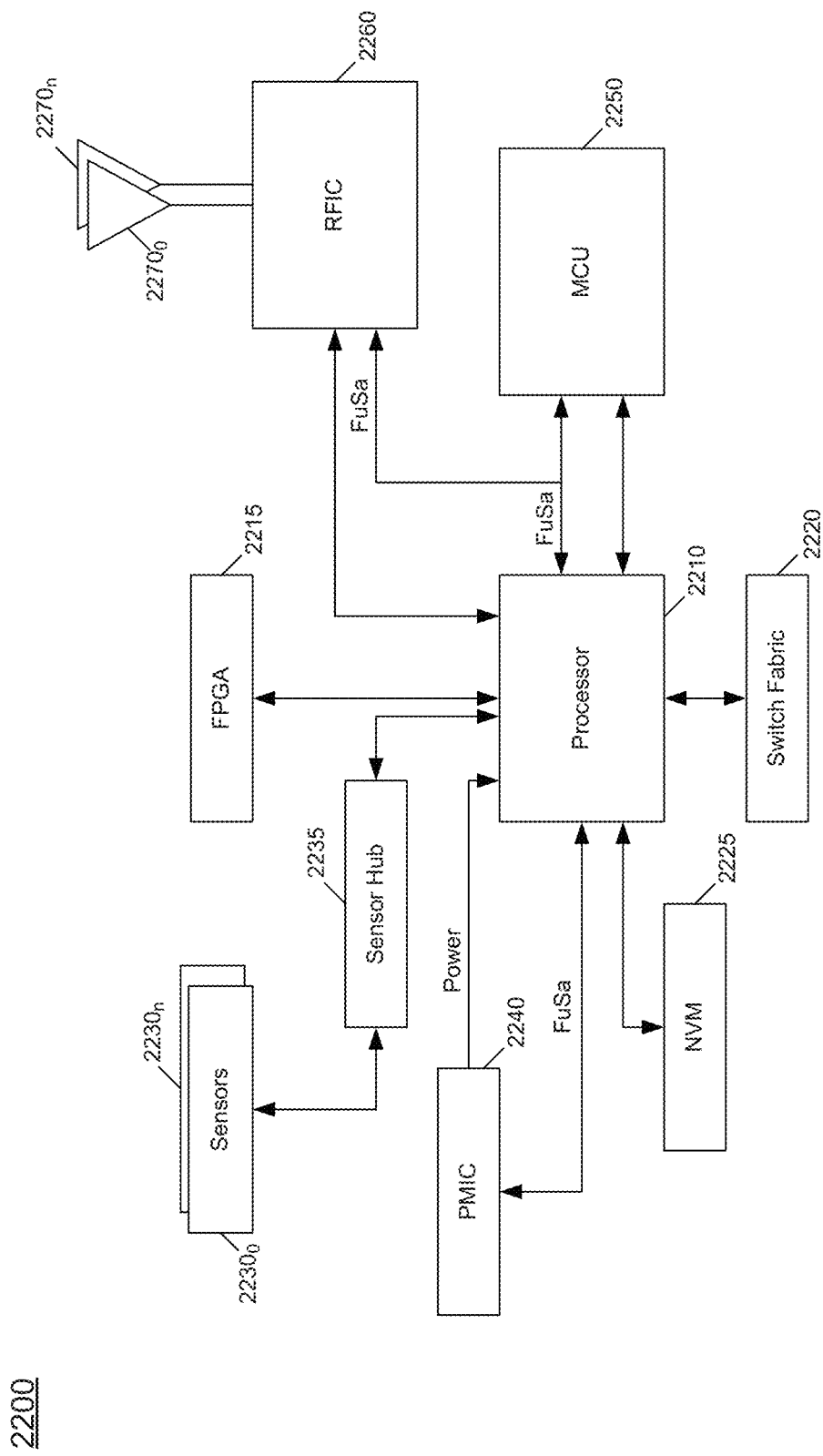
FIG. 22 is a block diagram of a system in accordance with another embodiment of the present invention.

Referring now to FIG. 22, shown is a block diagram of a system in accordance with another embodiment of the present invention. In the embodiment of FIG. 22, system 2200 is an autonomous driving computing system. As such, system 2200 may be implemented within a vehicle that provides for some level of autonomous driving. Understand that with different levels of autonomous driving control, different levels of workloads may be executed within system 2200 to perform some or all driving tasks autonomously.

As illustrated, system 2200 includes a processor 2210, which may be a general-purpose multicore processor or other SoC. In different implementations, multiple such processors may be implemented to flexibly allocate autonomous driving workloads across these processors. Processor 2210 receives power that is controlled by a power management integrated circuit (PMIC) 2240. As further illustrated, functional safety and other diagnostic testing as described herein, both within processor 2210 and PMIC 2240 may occur, with results communicated between these components.

System 2200 may further include one or more field programmable gate arrays (FPGAs) 2215 or other programmable accelerators to which certain autonomous driving workloads may be offloaded. Processor 2210 further couples to a non-volatile memory 2225, which in an embodiment may be implemented as a flash memory. As described herein, non-volatile memory 2225 may persistently store test patterns that may be used to perform self-testing of processor 2210, PMIC 2240 and additional components within system 2200. To provide communication with other components within a vehicle, processor 2210 further couples to a switch fabric 2220 which in an embodiment may be implemented as an Ethernet switch fabric that in turn may couple to other components within a vehicle, including display components, vehicle infotainment systems, and so forth. Still further, processor 2210 (and switch fabric 2220) also couple to a microcontroller 2250 which also may be involved in the functional safety testing.

Furthermore, to enable interaction with other systems, including other vehicles, roadway systems, over-the-air update sources, infotainment content sources, sensor data communication and so forth, processor 2210 and MCU 2250 may couple to one or more radio frequency integrated circuits (RFICs) 2260. In embodiments, RFIC 2260 may be configured to support 5G-based specifications for communication of automotive and other data via a variety of wireless networks. To this end, RFIC 2260 may couple to one or more antennas $2270_0$-$2270_n$ of a vehicle.

As further illustrated in FIG. 22, system 2200 may include a plurality of sensors $2230_0$-$2230_n$ that provide sensor information, via a sensor hub 2235 to processor 2210. Although the scope of the present invention is not limited in this regard in embodiments, such sensors may include lidar, ultrasound, radar and optical sensors, among other sensor types. Sensor hub 2235 may be configured to fuse at least some of this data to provide information regarding the vehicle's surroundings, for provision to processor 2210. In turn, processor 2210 and/or FPGA 2215 may use this fused sensor information in connection with performing autonomous driving workloads. Understand while shown at this high level in the embodiment of FIG. 22, many variations and alternatives are possible.

The following examples pertain to further embodiments.

In one example, a processor includes: a first core; and an interface circuit coupled to the first core to interface the first core to additional circuitry of the processor, where in response to an in-field self test instruction, the first core is to save a state of the first core to a low power memory, enter into a diagnostic sleep state and execute an in-field self test in the diagnostic sleep state, wherein the first core appears to be inactive in the diagnostic sleep state.

In an example, the processor further comprises a plurality of cores including the first core and a second core, where the second core is to save a state of at least a portion of the interface circuit to the low power memory and flush a shared cache memory to a memory hierarchy.

In an example, the second core is, after the shared cache memory flush, to obtain a test pattern and store the test pattern in the shared cache memory.

In an example, the second core is to validate the test pattern and in response to the test pattern validation, decrypt the test pattern, program a test controller with operating parameter information for the in-field self test and thereafter enter into the diagnostic sleep state.

In an example, in response to a failure of the in-field self test, the test controller is to send an error signal to one or more of the plurality of cores and log error information in a status storage, where the status storage is accessible via a sideband network.

In an example, the processor is to receive an over-the-air update including one or more test patterns and store the one or more test patterns in a storage of a system including the processor.

In an example, after the storage of the one or more test patterns, the first core is to use the one or more test patterns to perform the in-field self test in response to a second in-field self test instruction.

In an example, in response to the first core being in the diagnostic sleep state, the interface circuit is to isolate the first core from the additional circuitry and trigger a test controller to initiate the in-field self test on the first core.

In an example, after execution of the in-field self test on the first core, the interface circuit is to cause the first core to be reset and thereafter continue execution of instructions at a first instruction following the in-field self test instruction.

In another example, a method includes: receiving, in a core of a processor, an instruction to initiate an in-field self test of the core; in response to the instruction, saving a state of the core and a state of shared circuitry of the processor to a first memory of the processor; obtaining a test pattern from a storage and storing the test pattern in a shared cache memory of the processor; programming a test controller of the processor with operating parameters for the in-field self test, based at least in part on configuration information associated with the test pattern; and entering into a diagnostic sleep state and in response to a signal from the test controller, executing the in-field self test during the diagnostic sleep state.

In an example, the method further comprises: verifying the test pattern; in response to verifying the test pattern, determining whether a hash value of the test pattern matches a signed hash value; and in response to determining that the hash value matches the signed hash value, decrypting the test pattern and storing the decrypted test pattern in the shared cache memory.

In an example, executing the in-field self test comprises reading the decrypted test pattern from the shared cache memory and performing the in-field self test according to the test pattern.

In an example, the method further comprises receiving an over-the-air download of the in-field self test and storing the in-field self test to the storage, where the in-field self test is encrypted and signed.

In an example, the method further comprises executing the in-field self test on a plurality of cores of the processor concurrently during the diagnostic sleep state in which the plurality of cores appear to other circuitry of the processor as being in a low power state.

In an example, the in-field self test comprises at least one functional safety test, and the method further comprises performing a plurality of iterations of the in-field self test during functional execution on the core.

In another example, a computer readable medium including instructions is to perform the method of any of the above examples.

In another example, a computer readable medium including data is to be used by at least one machine to fabricate at least one integrated circuit to perform the method of any one of the above examples.

In another example, an apparatus comprises means for performing the method of any one of the above examples.

In yet another example, a system comprises a multicore processor including a shared cache memory, a plurality of cores to execute functional operations, an interface circuit to interface the plurality of cores to another portion of the multicore processor and a power controller coupled to the plurality of cores, where a first core of the plurality of cores is to enter into a diagnostic sleep state in which the first core is isolated in response to an instruction to execute an in-field self test while at least the another portion of the multicore processor continues to execute functional operations, the first core to save a state of the first core and a state of the interface circuit to a first storage, obtain a self-test suite and store the self-test suite in the shared cache memory, execute the self-test suite during the diagnostic sleep state and report a result of the execution of the self-test suite to the power controller. The system may further include system memory to store the self-test suite.

In an example, the system comprises an automotive vehicle computing system, and the power controller is to cause the first core to execute the self-test suite during operation of the automotive vehicle computing system.

In an example, in the diagnostic sleep state, the first core is to execute the self-test suite and appear to the another portion of the multicore processor as in a low power state.

In an example, the first core is to flush contents of the shared cache memory to the system memory before the self-test suite is obtained, and obtain the contents of the shared cache memory from the system memory to enable the first core to restart the execution of the functional operations.

In an example, the processor comprises a plurality of clusters each including a subset of the plurality of cores, the first storage and the shared cache memory, and when a first cluster is in the diagnostic sleep state, at least a second cluster is to continue the execution of the functional operations.

In a still further example, an apparatus comprises: means for receiving an instruction to initiate an in-field self test of a core means of a processor; means for saving a state of the core means and a state of shared circuitry means of the processor to a first memory means; means for obtaining a test pattern from a storage means for storage in a shared cache memory means of the processor; means for programming a test control means with operating parameters for the in-field self test, based at least in part on configuration information associated with the test pattern; means for entering into a diagnostic sleep state; and means for executing the in-field self test during the diagnostic sleep state.

In an example, the apparatus further comprises: means for verifying the test pattern; means for determining whether a hash value of the test pattern matches a signed hash value; and means for decrypting the test pattern and storing the decrypted test pattern in the shared cache memory means.

In an example, the means for executing is to read the decrypted test pattern from the shared cache memory means and perform the in-field self test according to the test pattern.

In an example, the apparatus further comprises: means for receiving an over-the-air download of the in-field self test; and means for storing the in-field self test to the storage means, where the in-field self test is encrypted and signed.

In an example, the apparatus further comprises means for executing the in-field self test on a plurality of core means concurrently during the diagnostic sleep state.

Understand that various combinations of the above examples are possible.

Note that the terms "circuit" and "circuitry" are used interchangeably herein. As used herein, these terms and the term "logic" are used to refer to alone or in any combination, analog circuitry, digital circuitry, hard wired circuitry, programmable circuitry, processor circuitry, microcontroller circuitry, hardware logic circuitry, state machine circuitry and/or any other type of physical hardware component. Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. Embodiments also may be implemented in data and may be stored on a non-transitory storage medium, which if used by at least one machine, causes the at least one machine to fabricate at least one integrated circuit to perform one or more operations. Still further embodiments may be implemented in a computer readable storage medium including information that, when manufactured into a SoC or other processor, is to configure the SoC or other processor to perform one or more operations. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A processor comprising:
a first core; and
an interface circuit coupled to the first core to interface the first core to additional circuitry of the processor, wherein in response to an in-field self test instruction when the first core is in normal operation, the first core is to enter into a diagnostic sleep state in which the first core is isolated from the normal operation, and execute an in-field self test, wherein in the diagnostic sleep state the first core appears to be inactive but is in an active state.

2. The processor of claim 1, wherein the processor further comprises a first plurality of cores including the first core and a second core and a second plurality of cores, wherein the first plurality of cores are to enter the diagnostic sleep state while the second plurality of cores are to continue the normal operation.

3. The processor of claim 1, wherein the diagnostic sleep state comprises an unbreakable sleep state.

4. The processor of claim 1, wherein the first core comprises a self-test register.

5. The processor of claim 4, wherein the in-field self test instruction is to cause self-test information to be written into the self-test register.

6. The processor of claim 5, wherein the self-test information comprises a location of a test pattern to be used for the in-field self test and a type of the in-field self test.

7. The processor of claim 1, wherein the processor is to receive the in-field self test instruction from firmware.

8. The processor of claim 1, wherein the processor is to receive an over-the-air update including one or more test patterns and store the one or more test patterns in a storage of a system including the processor.

9. The processor of claim 1, further comprising a power controller to periodically cause the first core to enter into the diagnostic sleep state.

10. A machine-readable medium having stored thereon instructions, which if performed by a machine cause the machine to perform a method comprising:
  receiving, in a core of a processor, an instruction to initiate an in-field self test of the core;
  in response to the instruction, saving a state of the core and a state of shared circuitry of the processor to a first memory of the processor;
  obtaining a test pattern from a storage and storing the test pattern in a shared cache memory of the processor; and
  entering into a diagnostic sleep state in which the core is in an isolation mode in which the core appears to be in a low power state, and executing the in-field self test on the core during the diagnostic sleep state.

11. The machine-readable medium of claim 10, wherein the method further comprises:
  verifying the test pattern;
  in response to verifying the test pattern, determining whether a hash value of the test pattern matches a signed hash value; and
  in response to determining that the hash value matches the signed hash value, decrypting the test pattern and storing the decrypted test pattern in the shared cache memory.

12. The machine-readable medium of claim 11, wherein executing the in-field self test comprises reading the decrypted test pattern from the shared cache memory and performing the in-field self test according to the test pattern.

13. The machine-readable medium of claim 10, wherein the method further comprises receiving an over-the-air download of the in-field self test and storing the in-field self test to the storage.

14. The machine-readable medium of claim 10, wherein the method further comprises executing the in-field self test on a plurality of cores of the processor concurrently during the diagnostic sleep state in which the plurality of cores appear to other circuitry of the processor as being in the low power state.

15. The machine-readable medium of claim 10, wherein the method further comprises periodically performing the in-field self test during functional execution on the core.

16. A system comprising:
  a multicore processor including a shared cache memory, a plurality of cores including a first cluster and a second cluster to execute functional operations, and a power controller coupled to the plurality of cores, wherein the power controller is to cause the first cluster to enter into an isolation mode in which a first core of the first cluster is to enter into a diagnostic sleep state in response to an instruction to execute an in-field self test while at least the second cluster continues to execute the functional operations, the first core to save a state of the first core, obtain a self-test suite and store the self-test suite in the shared cache memory, execute the self-test suite during the diagnostic sleep state and report a result of the execution of the self-test suite to the power controller; and
  a system memory to store the self-test suite.

17. The system of claim 16, wherein the system comprises an automotive vehicle computing system, and wherein the power controller is to cause the first core to execute the self-test suite during operation of the automotive vehicle computing system.

18. The system of claim 16, wherein in the diagnostic sleep state, the first core is to execute the self-test suite and appear to the second cluster as in a low power state.

19. The system of claim 16, wherein the processor is to receive an over-the-air update including one or more test patterns of the self-test suite and store the one or more test patterns in a storage.

20. The system of claim 16, further comprising a field programmable gate array (FPGA) coupled to the processor, wherein the FPGA is to execute an autonomous driving workload based at least in part on sensor information.

\* \* \* \* \*